United States Patent
Cheon et al.

(10) Patent No.: US 10,777,577 B2
(45) Date of Patent: Sep. 15, 2020

(54) 3-DIMENSIONAL SEMICONDUCTOR MEMORY DEVICE

(71) Applicant: Samsung Electronics Co., Ltd., Suwon-si (KR)

(72) Inventors: Ji-sung Cheon, Ansan-si (KR); Seok-cheon Baek, Hwaseong-si (KR); Yoon-hwan Son, Seoul (KR); Jun-young Choi, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/459,684

(22) Filed: Jul. 2, 2019

(65) Prior Publication Data

US 2020/0203367 A1    Jun. 25, 2020

(30) Foreign Application Priority Data

Dec. 19, 2018  (KR) .......................... 10-2018-0165466

(51) Int. Cl.
   *H01L 29/92*      (2006.01)
   *H01L 27/11582*   (2017.01)
   *H01L 27/11565*   (2017.01)

(52) U.S. Cl.
   CPC .. *H01L 27/11582* (2013.01); *H01L 27/11565* (2013.01)

(58) Field of Classification Search
   CPC .................... H01L 27/11582; H01L 27/11565
   USPC ......................................................... 257/324
   See application file for complete search history.

(56) References Cited

U.S. PATENT DOCUMENTS

| | | | |
|---|---|---|---|
| 8,809,938 B2 | 8/2014 | Hwang et al. | |
| 8,971,118 B2 | 3/2015 | Jin et al. | |
| 9,230,987 B2 | 1/2016 | Pachamuthu et al. | |
| 9,818,693 B2 | 11/2017 | Toyama et al. | |
| 9,853,043 B2 | 12/2017 | Lu et al. | |
| 9,941,297 B2 | 4/2018 | Nishikawa et al. | |
| 2016/0293539 A1* | 10/2016 | Park .................. | H01L 27/11548 |
| 2017/0278571 A1 | 9/2017 | Chowdhury et al. | |
| 2018/0240811 A1 | 8/2018 | Kim et al. | |
| 2019/0214403 A1* | 7/2019 | Oike .................. | H01L 27/11565 |
| 2020/0152573 A1* | 5/2020 | Oh .................... | H01L 27/11519 |

* cited by examiner

*Primary Examiner* — David S Blum
(74) *Attorney, Agent, or Firm* — Muir Patent Law, PLLC

(57) ABSTRACT

A three-dimensional semiconductor memory device includes a substrate including a cell array region and a connecting region; a stacked structure including a lower stacked structure and an upper stacked structure sequentially stacked on a substrate, wherein the stacked structure includes an insulating layer and electrodes alternately stacked vertically on the substrate; a vertical structure in a channel hole passing through the lower stacked structure and the upper stacked structure on the cell array region; and a dummy structure in a dummy hole passing through at least one of a lower stacked structure and an upper stacked structure on a connecting region. The connecting region includes a second connecting region on one side of the cell array region and a first connecting region on one side of the second connecting region. A surface pattern shape of the dummy hole in the second connecting region is different from a shape of the dummy hole in the first connecting region.

20 Claims, 26 Drawing Sheets

FIG. 27
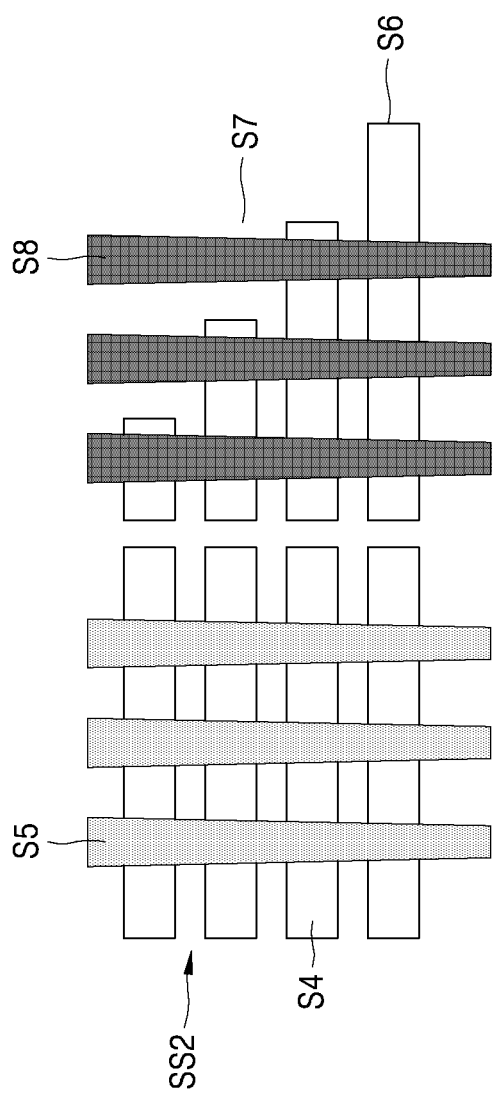
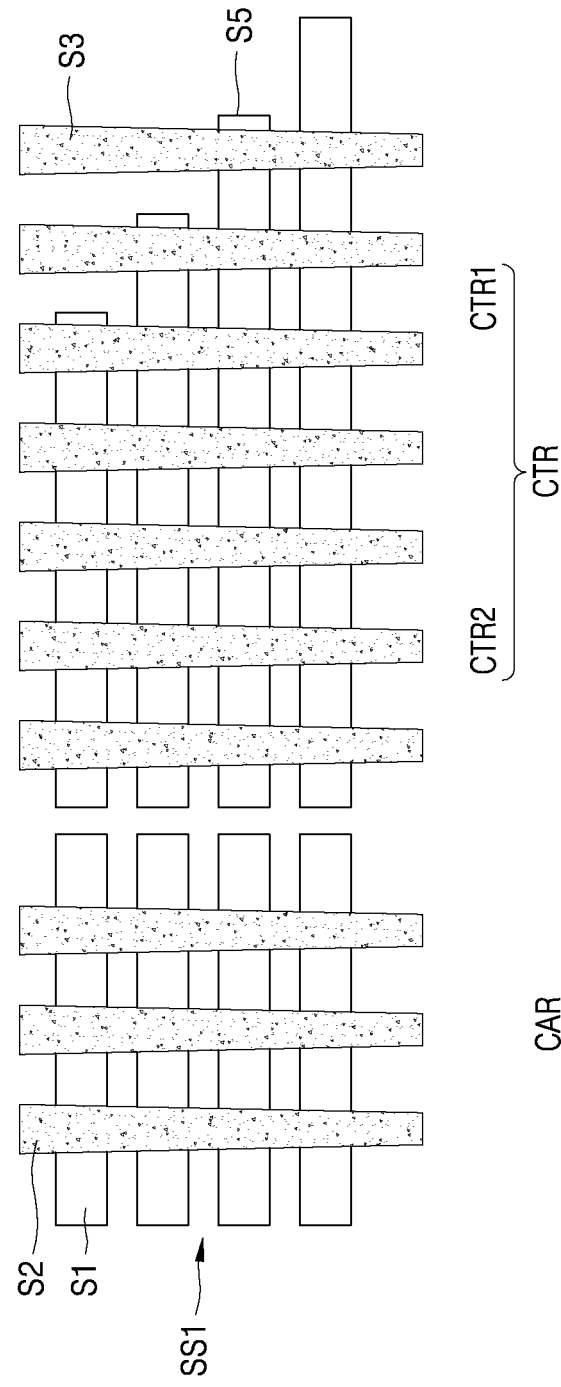

3-DIMENSIONAL SEMICONDUCTOR MEMORY DEVICE

CROSS-REFERENCE TO RELATED APPLICATION

This application claims the benefit of Korean Patent Application No. 10-2018-0165466, filed on Dec. 19, 2018, in the Korean Intellectual Property Office, the disclosure of which is incorporated herein in its entirety by reference.

BACKGROUND

The inventive concept relates to a semiconductor memory device, and more particularly, to a 3-dimensional semiconductor memory device.

The degree of integration of semiconductor memory devices has been increased in order to satisfy excellent performance and low price demanded by consumers. In the case of a 2-dimensional or planar semiconductor device, the degree of integration is mainly determined by an area occupied by a unit memory cell, thus being significantly influenced by the level of a fine patterning technique.

However, because super-expensive fabrication equipment is needed for the miniaturization of a pattern, the degrees of integration of 2-dimensional semiconductor devices are increasing, but are still limited. Accordingly, 3-dimensional semiconductor memory devices having 3-dimensionally arranged memory cells have been proposed. In addition, the proposed 3-dimensional semiconductor memory devices need to be fabricated reliably with a high freedom of design.

SUMMARY

The inventive concept provides a 3-dimensional semiconductor memory device having improved integration, higher freedom of design, and improved reliability.

According to some example aspects, the disclosure is directed to a 3-dimensional semiconductor memory device comprising: a substrate comprising a cell array region and a connecting region; a stacked structure comprising insulation layers and electrodes alternately and vertically stacked on the substrate, and comprising a stepped structure in the connecting region, and comprising a lower stacked structure and an upper stacked structure sequentially stacked on the substrate; vertical structures in channel holes penetrating through the lower stacked structure and the upper stacked structure on the cell array region; and dummy structures in dummy holes penetrating through at least one of the lower stacked structure and the upper stacked structure on the connecting region, wherein the connecting region comprises a second connecting region on one side of the cell array region and a first connecting region on one side of the second connecting region, the second connecting region being between the first connecting region and the cell array region, and wherein the dummy holes comprise a first dummy hole in the first connecting region and a second dummy hole in the second connecting region, and a surface pattern shape of the first dummy hole is different from a surface pattern shape of the second dummy hole.

According to some example aspects, the disclosure is directed to a 3-dimensional semiconductor memory device comprising: a substrate comprising a cell array region and a connecting region; a stacked structure comprising insulation layers and electrodes alternately and vertically stacked on the substrate, and comprising a stepped structure in the connecting region, and comprising a lower stacked structure and an upper stacked structure sequentially stacked on the substrate; vertical structures penetrating through the lower stacked structure and the upper stacked structure on the cell array region; and dummy structures penetrating through at least one of the lower stacked structure and the upper stacked structure on the connecting region, wherein the connecting region comprises a second connecting region on one side of the cell array region and a first connecting region on one side of the second connecting region, the second connecting region being between the first connecting region and the cell array region, wherein the dummy structures comprise a first dummy structure and a second dummy structure, wherein the second dummy structure comprises a second lower dummy structure and a second upper dummy structure which respectively penetrate through the lower stacked structure and the upper stacked structure of the second connecting region and are connected to each other, and the first dummy structure comprises a first lower dummy structure and a first upper dummy structure which respectively penetrate through the lower stacked structure and an insulation layer of the first connecting region and are connected to each other, and wherein the second dummy structure comprises a non-continuous portion where diameters of the second lower dummy structure and the second upper dummy structure vary non-continuously at a boundary region of the second lower dummy structure and the second upper dummy structure.

According to some example aspects, the disclosure is directed to a 3-dimensional semiconductor memory device comprising: a substrate comprising a cell array region and a connecting region; a stacked structure comprising insulation layers and electrodes alternately and vertically stacked on the substrate, and comprising a stepped structure in the connecting region, and comprising a lower stacked structure and an upper stacked structure sequentially stacked on the substrate; vertical structures penetrating through the lower stacked structure and the upper stacked structure on the cell array region; and dummy structures penetrating through at least one of the lower stacked structure and the upper stacked structure on the connecting region, wherein the connecting region comprises a second connecting region on one side of the cell array region and a first connecting region on one side of the second connecting region, the second connecting region being between the first connecting region and the cell array region, wherein the dummy structures comprise a first dummy structure and a second dummy structure, wherein the second dummy structure comprises a second lower dummy structure and a second upper dummy structure which respectively penetrate through the lower stacked structure and the upper stacked structure of the second connecting region and are connected to each other, and the first dummy structure comprises a first lower dummy structure which penetrates through the lower stacked structure of the first connecting region, wherein the second dummy structure comprises a non-continuous portion where diameters of the second lower dummy structure and the second upper dummy structure vary non-continuously at a boundary region of the second lower dummy structure and the second upper dummy structure, and wherein an insulation layer covering the lower stacked structure is formed in the first connecting region.

BRIEF DESCRIPTION OF THE DRAWINGS

Embodiments of the inventive concept will be more clearly understood from the following detailed description taken in conjunction with the accompanying drawings in which:

FIG. 27 is a conceptual diagram for describing a sequence of fabricating a 3-dimensional semiconductor memory device according to an example embodiment.

DETAILED DESCRIPTION OF THE EMBODIMENTS

Figure 1:
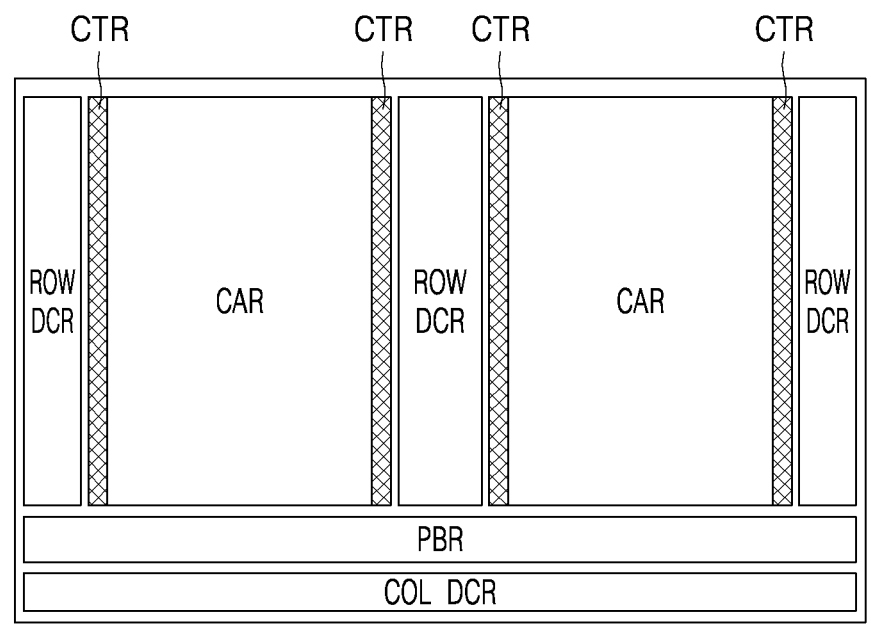
FIG. 1 is a block diagram schematically showing a 3-dimensional semiconductor memory device, according to an example embodiment.

FIG. 1 is a block diagram schematically showing a 3-dimensional semiconductor memory device, according to an example embodiment.

In FIG. 1, the 3-dimensional semiconductor memory device may include cell array regions CAR and a peripheral circuit region (not shown). The planar configuration of the 3-dimensional semiconductor memory device may vary, and the inventive concept is not limited to that shown in FIG. 1. The 3-dimensional semiconductor memory device may be a non-volatile semiconductor memory device. The peripheral circuit region may include row decoder regions ROW DCR, a page buffer region PBR, a column decoder region COL DCR, and control circuit regions (not shown).

In some embodiments, connecting regions CTR may be arranged between the cell array regions CAR and the row decoder regions ROW DCR. The connecting regions CTR may be formed by extending components included in the cell array regions CAR and may be referred to as extended regions.

A memory cell array including a plurality of memory cells is disposed in a cell array region CAR. In some embodiments, a memory cell array includes 3-dimensionally arranged memory cells and a plurality of word lines and a plurality of bit lines that are electrically connected to the memory cells.

A row decoder for selecting word lines of a memory cell array may be disposed in a row decoder region ROW DCR, and a wire structure for electrically connecting a memory cell array to the row decoder may be disposed in a connecting region CTR.

The row decoder selects one of the word lines of a memory cell array according to address information. The row decoder may provide word line voltages to a selected word line and unselected word lines, respectively, in response to a control signal of a control circuit.

A page buffer for reading information stored in memory cells may be disposed in the page buffer region PBR. The page buffer may temporarily store data to be stored in the memory cells or detect data stored in the memory cells, according to operation modes. The page buffer operates as a write driver circuit in a program operation mode and may operate as a sense amplifier circuit in a read operation mode.

In the column decoder region COL DCR, a column decoder connected to bit lines of a memory cell array is disposed. The column decoder may provide a data transfer path between the page buffer and an external device (e.g., a memory controller).

Figure 2:
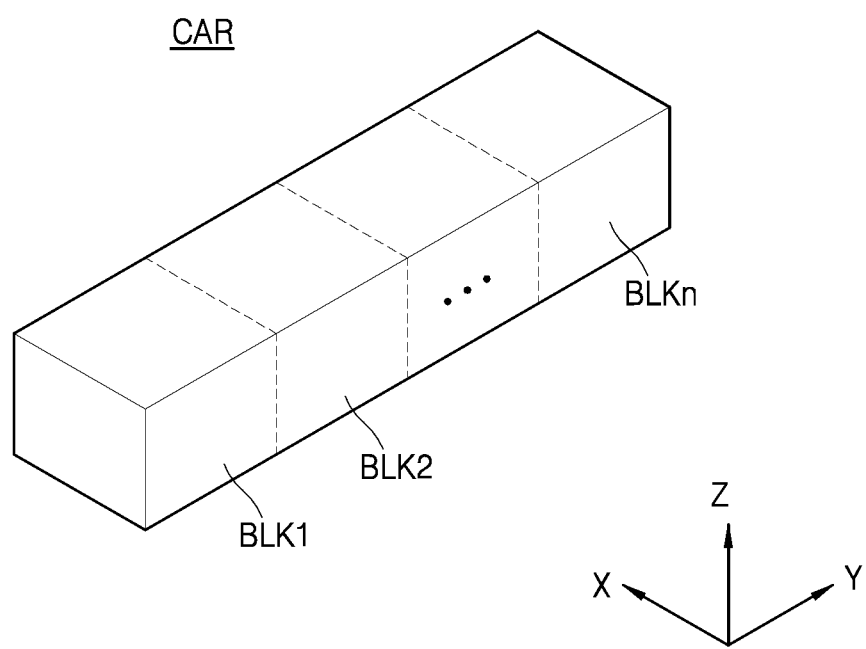
FIG. 2 is a schematic diagram for describing a cell array region of a 3-dimensional semiconductor memory device, according to an example embodiment.

FIG. 2 is a schematic diagram for describing a cell array region of a 3-dimensional semiconductor memory device according to an example embodiment.

In detail, a cell array region CAR may include a plurality of cell array blocks BLK1, BLK2, . . . , and BLKn (n is a positive integer). Each of the cell array blocks BLK1, BLK2, and BLKn may include a stacked structure including electrodes stacked in a third direction (Z-direction) on a plane extending in the first direction (X-direction) and the second direction (Y-direction).

The stacked structure may be combined with a plurality of vertical structures (e.g., semiconductor pillars) and may constitute memory cells arranged in a 3-dimensional shape. Each of the cell array blocks BLK1, BLK2, . . . , and BLKn may include bit lines electrically connected to memory cells. The memory cells of the three-dimensional memory cell array may be non-volatile memory cells, with vertically aligned groups of memory cells connected in series to form a string of memory cells, which may form a 3D NAND Flash nonvolatile memory.

Figure 3:
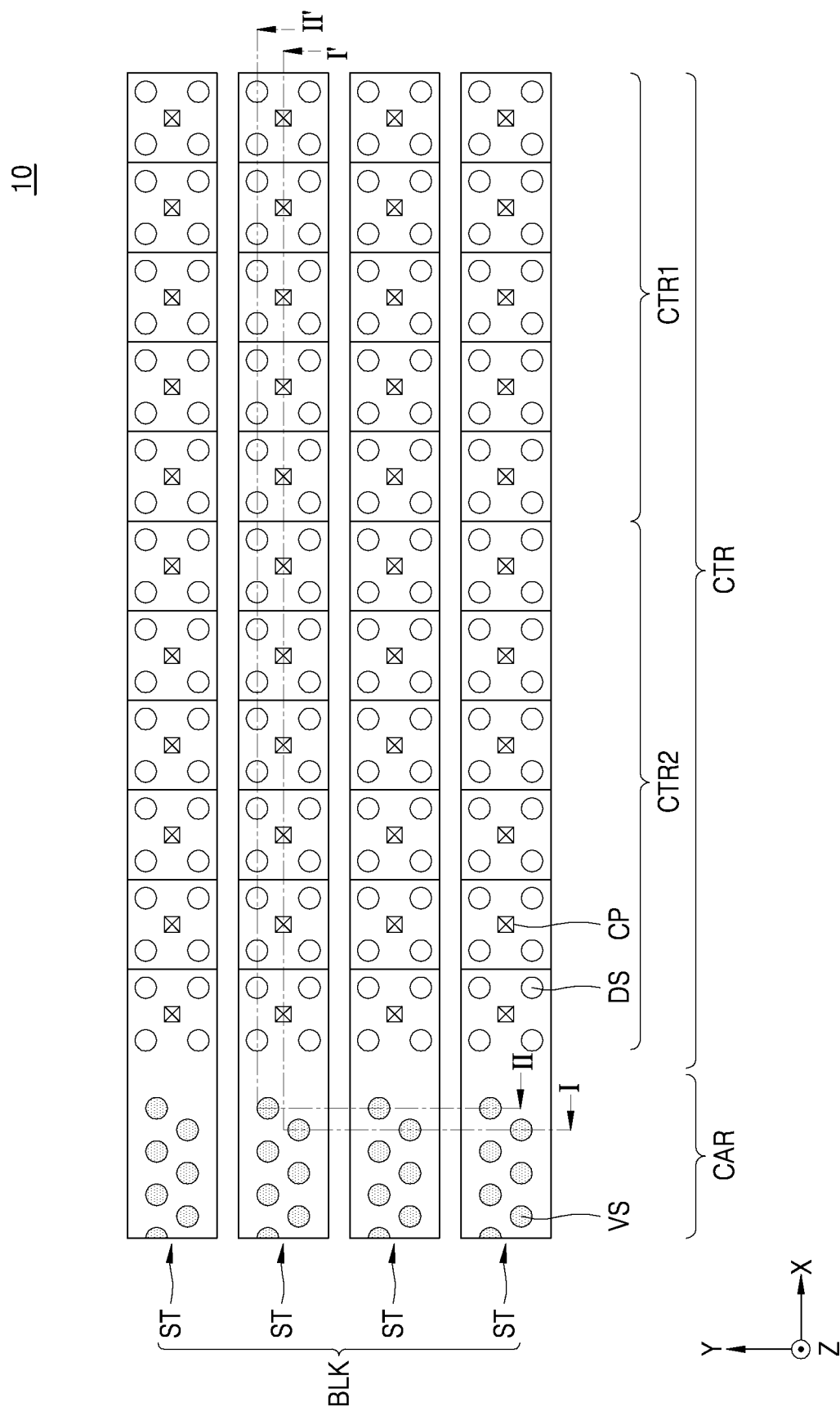
FIG. 3 is a layout diagram of a 3-dimensional semiconductor memory device, according to an example embodiment.
Figure 4:
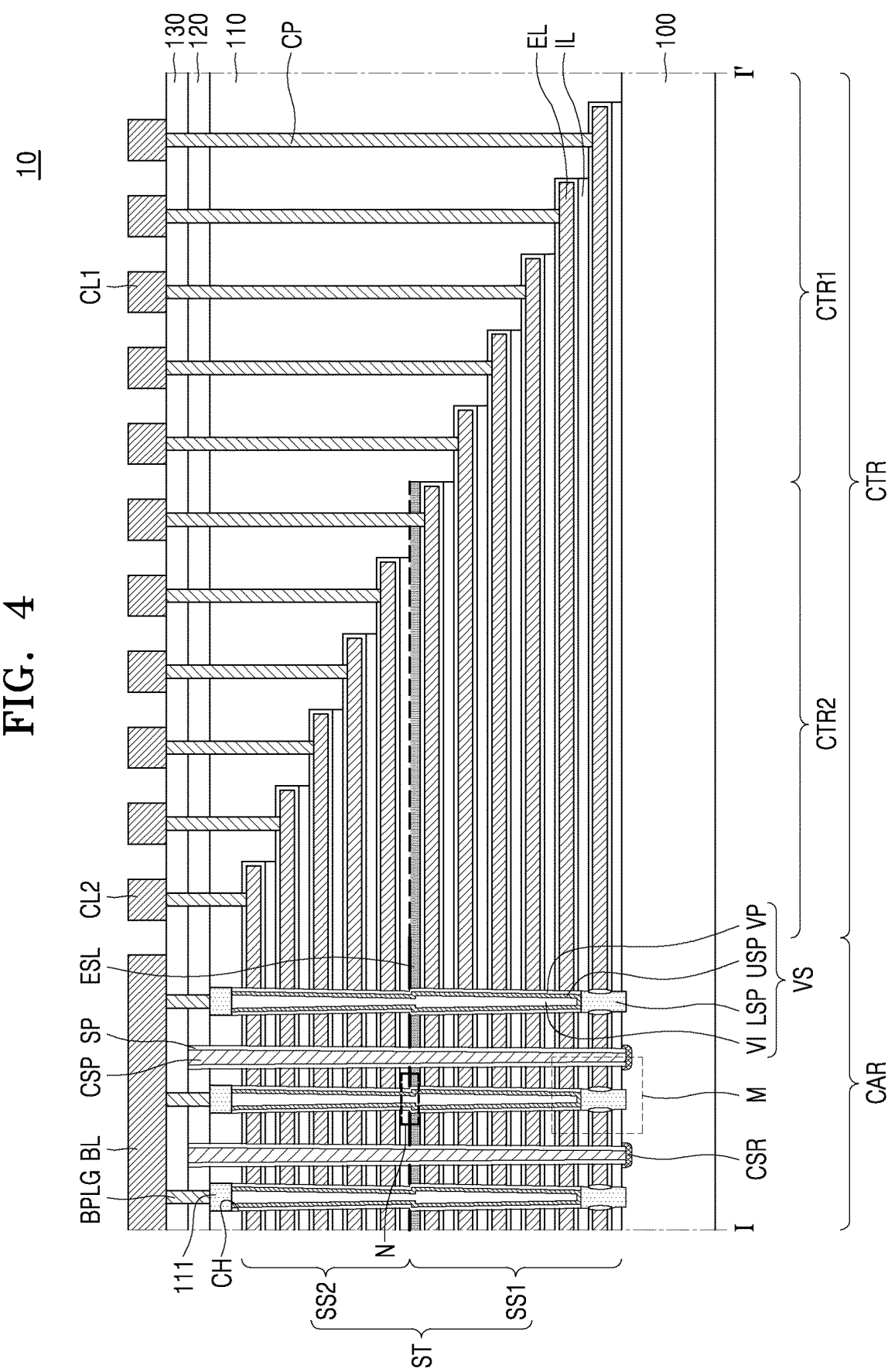
FIGS. 4 and 5 are cross-sectional views taken along lines I-I' and II-II' of FIG. 3, respectively.
Figure 5:
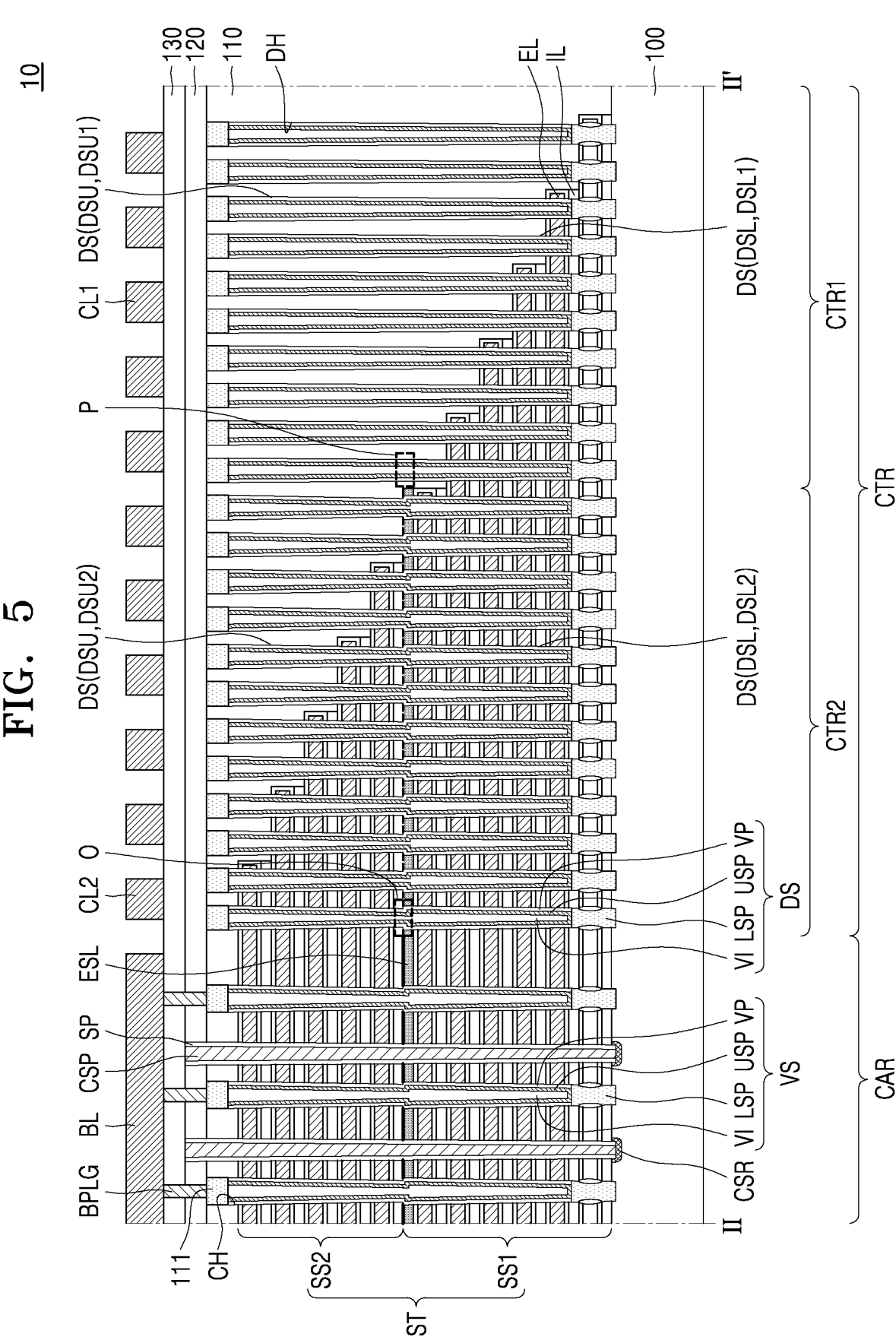
Figure 6A:
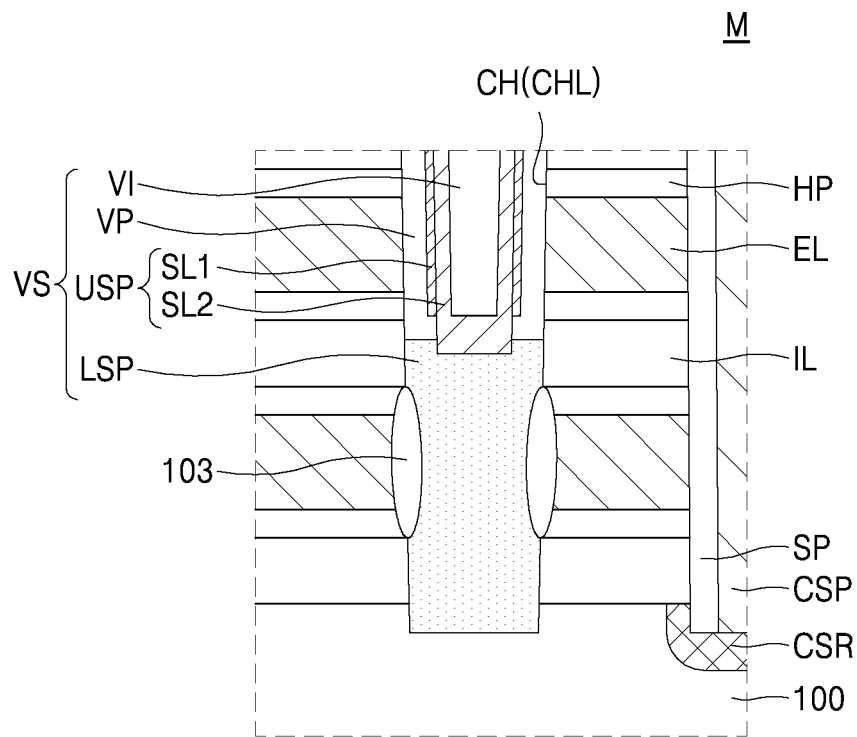
FIGS. 6A and 6B are enlarged sectional views of an M region and an N region of FIG. 4, respectively.
Figure 6B:
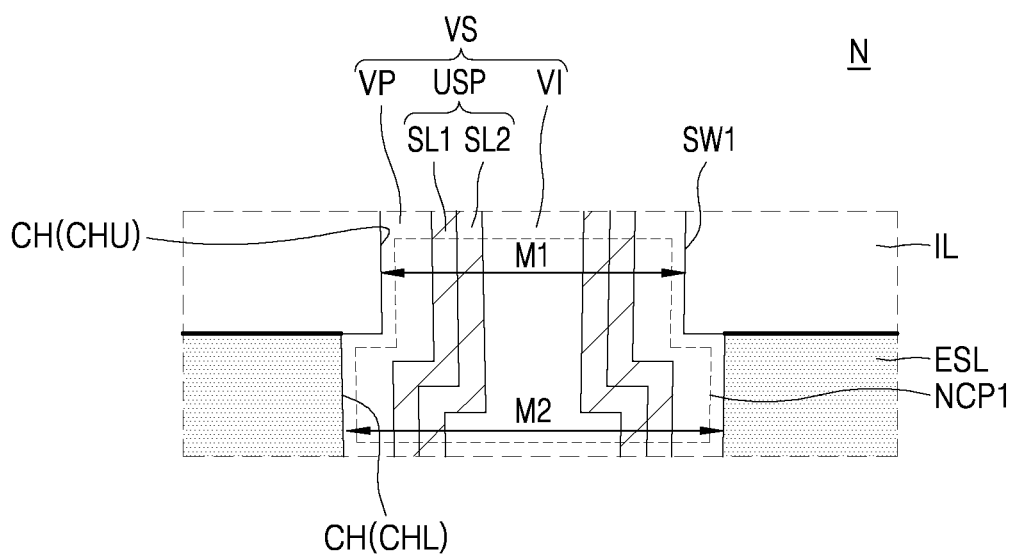
Figure 7A:
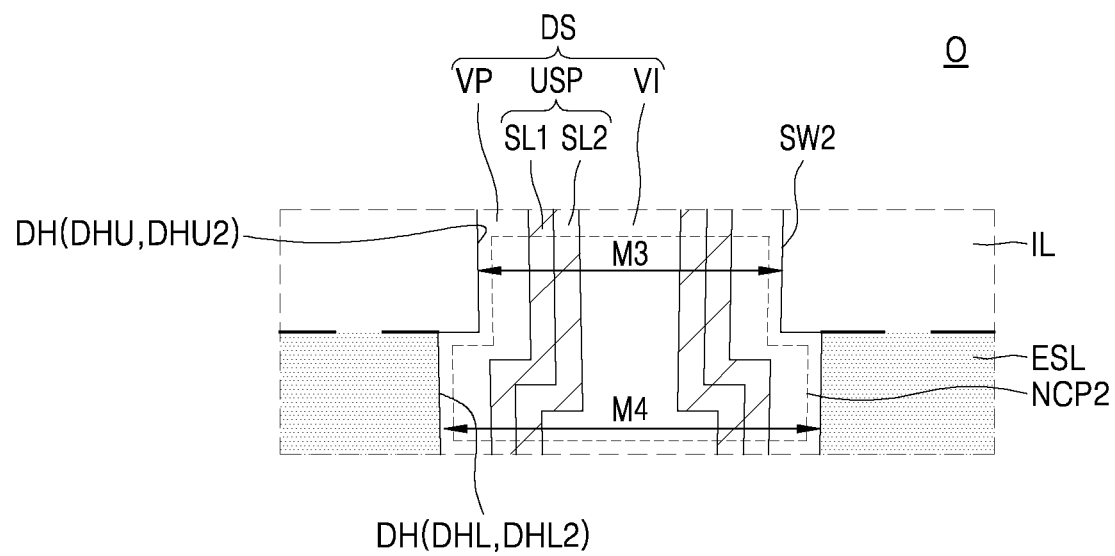
FIGS. 7A and 7B are enlarged sectional views of an O region and a P region of FIG. 5, respectively.
Figure 7B:
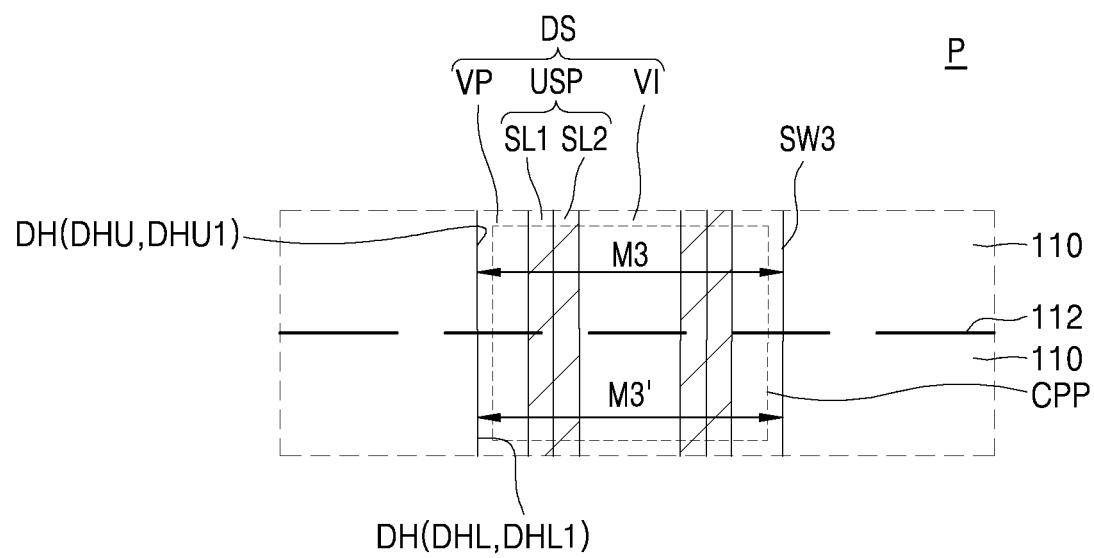

FIG. 3 is a layout diagram of a 3-dimensional semiconductor memory device according to an example embodiment. FIGS. 4 and 5 are cross-sectional views taken along lines I-I' and II-II' of FIG. 3, respectively. FIGS. 6A and 6B are enlarged sectional views of an M region and an N region of FIG. 4, respectively. FIGS. 7A and 7B are enlarged sectional views of an O region and a P region of FIG. 5, respectively.

Referring to FIGS. 3 to 5, 6A, 6B, 7A, and 7B, a 3-dimensional semiconductor memory device 10 may include a substrate 100 including the cell array region CAR and the connecting regions CTR. For example, the substrate 100 may be a silicon substrate, a germanium substrate, or a silicon-germanium substrate. In one embodiment, the substrate 100 may include a first conductivity type substrate, e.g., a p-type substrate.

A cell array block (BLK in FIG. 2) may be disposed on the substrate 100. The cell array block BLK may include stacked structures ST including insulation layers IL and electrodes EL that are alternately and vertically stacked. Each of the stacked structures ST may include a lower stacked structure SS1 and an upper stacked structure SS2.

The upper stacked structure SS2 may be disposed on the lower stacked structure SS1. The stacked structures ST may extend lengthwise in the first direction (X-direction) from the cell array region CAR to the connecting regions CTR. The stacked structures ST may be arranged in the second direction (Y-direction) that intersects with the first direction (X-direction). An item, layer, or portion of an item or layer described as extending "lengthwise" in a particular direction has a length in the particular direction and a width perpendicular to that direction, where the length is greater than the width.

Common source regions CSR may be provided in the cell array region CAR. The common source regions CSR may be arranged in portions of the substrate 100 between the stacked structures ST that are horizontally adjacent to one another. The common source regions CSR may extend lengthwise in the first direction (X-direction) in parallel to the stacked structures ST. The common source regions CSR may be arranged in the second direction (Y-direction). The common source regions CSR may be doped with impurities to have a second conductivity type. For example, the common source regions CSR may be doped with impurities like arsenic (As) or phosphorus (P) to have an n-type conductivity.

A common source plug CSP may be connected to a common source region CSR. The common source plug CSP may extend lengthwise in the first direction (X-direction) in parallel to the stacked structures ST. Insulation spacers SP may be between the common source plug CSP and the stacked structures ST.

The electrodes EL of the stacked structures ST may be stacked in the third direction (Z-direction) perpendicular to the top surface of the substrate 100. The electrodes EL may be vertically separated from one another by the insulation layers IL therebetween. The electrodes EL may constitute a stepped structure in the connecting regions CTR. For example, the height of the stacked structure ST on the connecting region CTR may decrease as a distance from the cell array region CAR increases in the first direction (X-direction). For example, a length in the x-direction of individual ones of the vertically stacked electrodes EL may incrementally decrease from the bottommost one of the stacked electrodes EL to the topmost one of the stacked electrodes EL, such that the length of each electrode EL progressively decreases the closer the electrode EL is to the top of the stacked structure ST.

One or more of the bottommost electrodes EL of the lower stacked structure SS1 may include a lower selection line. One or more of the topmost electrodes EL of the upper stacked structure SS2 may include an upper selection line. The electrodes EL, other than the lower selection line(s) and the upper selection line(s), may be word lines. In the connecting region CTR having a stepped structure, portions of the electrodes EL exposed at one side, that is, the portions connected to the contact plug CP may be referred to as word line pads.

In some embodiments, an etch stop layer ESL may be provided at the top of the lower stacked structure SS1. The etch stop layer ESL may be in direct contact with the bottommost insulating layer IL of the upper stacked structure SS2.

For example, the electrodes EL may include at least one selected from among a semiconductor doped with an impurity (e.g., silicon doped with an impurity), a metal (e.g., tungsten, copper, aluminum, etc.), a conductive metal nitride (e.g., titanium nitride, tantalum nitride, etc.), and a transition metal (e.g., titanium, tantalum, etc.). The insulation layers IL may include silicon oxide layers. The etch stop layer ESL may include a polysilicon film.

The etch stop layer ESL may be formed only when desired and, in some embodiments, may be omitted. When the etch stop layer ESL is not formed, the bottommost insulating layer IL of the upper stacked structure SS2 may directly contact a horizontal insulation layer HP.

The connecting regions CTR may include a second connecting region CTR2 disposed on one side of the cell array region CAR and a first connecting region CTR1 disposed on one side of the second connecting region CTR2. The second connecting region CTR2 may include a region where a second circuit line CL2 electrically connected to the electrodes EL of the upper stacked structure SS2 is disposed on one side of the cell array region CAR. The first connecting region CTR1 may include a region where a first circuit line CL1 electrically connected to the electrodes EL of the lower stacked structure SS1 is disposed on one side of the second connecting region CTR2.

The planar areas of the electrodes EL on the connecting regions CTR may be reduced as a distance from the top surface of the substrate 100 increases in the third direction (Z-direction). The bottommost electrode EL (the lower selection line) of the stacked structure ST may have the largest planar area. The topmost electrode EL (the upper selection line) of the stacked structure ST may have the smallest planar area.

In the cell array region CAR, a plurality of channel holes CH penetrating through the stacked structure ST may be formed. Vertical structures VS may be provided in the channel holes CH. When viewed from above, the vertical structures VS may be arranged in the first direction (X-direction). For example, the vertical structures VS may be arranged in a zigzag form in the first direction (X-direction). In another example, although not shown, the vertical structures VS may be arranged along a line in the first direction (X-direction).

Each of the vertical structures VS may include a vertical insulation layer VP, an upper semiconductor pattern USP, a lower semiconductor pattern LSP, and an insulation pattern VI. The insulation pattern VI may be referred to herein as a buried insulation pattern VI. The vertical insulation layer VP may extend toward the substrate 100 along the inner wall of the channel hole CH. The upper semiconductor pattern USP may cover the inner wall of the vertical insulation layer VP and also may extend toward the substrate 100 together with the vertical insulation layer VP.

Referring back to FIG. 6A, the lower semiconductor pattern LSP may be provided under the channel hole CH and directly contact the substrate 100. The lower semiconductor pattern LSP may penetrate through the bottommost electrode EL (the lower selection line) of the stacked structure ST. An oxidation pattern 103 may be between the lower semiconductor pattern LSP and the bottommost electrode EL (the lower selection line).

The upper semiconductor pattern USP may include a first semiconductor pattern SL1 and a second semiconductor pattern SL2. The second semiconductor pattern SL2 may be directly connected to the lower semiconductor pattern LSP. The second semiconductor pattern SL2 may have a pipe-like shape or a macaroni-like shape with a closed bottom. The interior of the second semiconductor pattern SL2 may be filled with the buried insulation pattern VI. The second semiconductor pattern SL2 may contact the inner wall of the first semiconductor pattern SL1.

The second semiconductor pattern SL2 may electrically connect the first semiconductor pattern SL1 to the lower semiconductor pattern LSP. The first semiconductor pattern SL1 may have a pipe-like shape or a macaroni-like shape of which the top and the bottom are open. The first semiconductor pattern SL1 may be apart from the lower semiconductor pattern LSP, and may not have direct contact with the lower semiconductor pattern LSP. The lower semiconductor pattern LSP and the upper semiconductor pattern USP may be used as a channel of a 3-dimensional memory device according to example embodiments.

In one example embodiment, the lower semiconductor pattern LSP and the upper semiconductor pattern USP may include silicon (Si), germanium (Ge), or a mixture thereof and may have different crystal structures. The lower semiconductor pattern LSP and the upper semiconductor pattern USP may have crystal structures including at least one selected from among a monocrystalline structure, an amorphous structure, and a polycrystalline structure. The lower semiconductor pattern LSP and the upper semiconductor pattern USP may be undoped or doped with impurities to have the first conductivity type that is the same as that of the substrate 100.

Referring back to FIGS. 3, 4, and 5, the diameter of the vertical structure VS in the lower stacked structure SS1 may gradually decrease in the direction toward the substrate 100. The diameter of the vertical structure VS in the upper stacked structure SS2 may gradually decrease in the direction toward the substrate 100. In the region between the lower stacked structure SS1 and the upper stacked structure SS2, the diameter of the vertical structure VS may change non-continuously. For example, a diameter of the lower portion of the vertical structure VS in the upper stacked structure SS2 may be smaller than a diameter of the upper portion of the vertical structure VS in the lower stacked structure SS1. In some embodiments, diameters of the upper portions of the vertical structure VS in the upper stacked structure SS2 and the lower stacked structure SS1 may be substantially the same, and diameters of the lower portions of the vertical structure VS in the upper stacked structure SS2 and the lower stacked structure SS1 may be substantially the same.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Referring back to FIG. 6B, the vertical structure VS may include at least one non-continuous portion NCP1. The non-continuous portion NCP1 may be between the lower stacked structure SS1 and the upper stacked structure SS2. The etch stop layer ESL may be adjacent to the non-continuous portion NCP1. The etch stop layer ESL may be at substantially the same level as the non-continuous portion NCP1. For example, the non-continuous portion NCP1 may include a horizontal surface that is substantially planar and parallel to the top surface of the substrate 100, and a top surface of the etch stop layer ESL may be substantially coplanar with the top surface of this horizontal surface.

The upper portion of the non-continuous portion NCP1 may have a first diameter M1, and the lower portion of the non-continuous portion NCP1 may have a second diameter M2. The diameter of the non-continuous portion NCP1 at the interface region or the boundary region between the lower stacked structure SS1 and the upper stacked structure SS2 may increase non-continuously. Therefore, the second diameter M2 may be greater than the first diameter M1. A sidewall SW1 of the vertical structure VS may have a non-continuous profile. For example, the sidewall SW1 of the vertical structure VS may have a stepped profile at the non-continuous portion NCP1. In some example embodiments, the stepped profile of the sidewall SW1 of the vertical structure VS may include a lower slanted sidewall, which is slanted with respect to the top surface of the substrate 100, a substantially horizontal upper surface, which is parallel with the top surface of the substrate 100, and an upper slanted sidewall, which is slanted with respect to the top surface of the substrate 100.

Referring back to FIG. 6A, horizontal insulation layers HP may be between the electrodes EL and the insulating layers IL. The horizontal insulation layer HP and the vertical insulation layer VP between the electrodes EL and the upper semiconductor pattern USP may constitute a data storage layer.

The 3-dimensional semiconductor memory device according to example embodiments may be a NAND flash memory device. For example, a data storage layer between the electrodes EL and the upper semiconductor pattern USP may include a tunnel insulation layer, a charge storage layer, and a blocking insulation layer. The tunnel insulation layer may be in direct contact with the upper semiconductor pattern USP.

The blocking insulation layer may be in direct contact with the electrodes EL. The charge storage layer may be between the tunnel insulation layer and the blocking insulation layer. Data stored in the data storage layer may be changed by using the Fowler-Nordheim tunneling caused by a voltage difference between the electrodes EL and the upper semiconductor pattern USP.

The tunnel insulation layer may include a material having a greater energy band gap than that of the charge storage layer. The tunnel insulation layer may include a high-k film, e.g., an aluminum oxide film, a hafnium oxide film, etc., or may include a silicon oxide film. The charge storage layer may include a silicon nitride layer, a silicon oxynitride layer, or a silicon-rich nitride layer. The blocking insulation layer may include a silicon oxide layer.

Referring back to FIGS. 3, 4, and 5, on the connecting region CTR, contact plugs CP may be connected to the electrodes EL of the stacked structure ST. For example, the number of contact plugs CP connected to the stacked structure ST may be equal to the number of electrodes EL constituting the stacked structure ST.

The contact plugs CP may be apart from one another in the first direction (X-direction). Since the electrodes EL constitute a stepped structure in the connecting region CTR, the bottom surfaces of the contact plugs CP may be at different heights from the substrate 100. As the distance from the cell array region CAR increases, the levels of the bottom surfaces of the contact plugs CP may lower. The vertical lengths in the third direction (Z-direction) of the contact plugs CP may correspond to the lengths in the first direction (X-direction) of individual ones of the vertically stacked electrodes EL. For example, a longest one of the contact plugs CP may be electrically connected to a longest one of the electrodes EL at the furthest distance from the cell array region CAR, and a shortest one of the contact plugs CP may be electrically connected to a shortest one of the electrodes EL at the closest distance to the cell array region CAR. In the connecting region CTR, a plurality of dummy holes DH penetrating through an insulation layer 110 and the stacked structure ST may be formed. The insulation layer 110 may be referred to herein as a buried insulation layer 110. Dummy holes DH may penetrate through at least one of the lower stacked structure SS1 and the upper stacked structure SS2 on the connecting region CTR. Dummy holes DH may penetrate through the insulation layer 110 on a portion of the first connecting region CTR1, as shown in FIG. 5. Dummy structures DS may be provided in the dummy holes DH. The dummy structures DS may be selectively provided only on the connecting region CTR and may not be provided on the cell array region CAR. The dummy structures DS may be disposed adjacent to the contact plugs CP, but may also be apart from the contact plugs CP. As used herein, the term "dummy" is used to refer to a component that has the same or similar structure and shape as other components but does not have a substantial function and exists only as a pattern in the device. Here, the dummy structures DS are not effective to function for read or write operations. For example, dummy structures DS may not be electrically connected to bit line contacts, and therefore cannot connect to bit lines.

The dummy structures DS may physically support a stacked structure ST on the connecting region CTR. In one embodiment, like the vertical structure VS, each of the dummy structures DS may include the vertical insulation layer VP, the upper semiconductor pattern USP, the lower semiconductor pattern LSP, and the buried insulation pattern VI.

The diameter of the dummy structure DS may gradually decrease as a distance to the substrate 100 decreases. The diameter of the dummy structure DS may be continuously reduced in a direction from the upper stacked structure SS2 to the lower stacked structure SS1.

As shown in FIG. 5, the dummy structure DS may include a lower dummy structure DSL and an upper dummy structure DSU. The lower dummy structure DSL may include a second lower dummy structure DSL2 and a first lower dummy structure DSL1 formed in the second connecting region CTR2 and the first connecting region CTR1, respectively. The upper dummy structure DSU may include a second upper dummy structure DSU2 and a first upper dummy structure DSU1 formed in the second connecting region CTR2 and the first connecting region CTR1, respectively.

In the second connecting region CTR2, the second upper dummy structure DSU2 and the second lower dummy structure DSL2 may be connected in the vertical direction. In the first connecting region CTR1, the first upper dummy structure DSU1 and the first lower dummy structure DSL1 may be vertically connected and constitute one body. For example, the first upper dummy structure DSU1 and the first lower dummy structure DSL1 may be formed in a single process. In the first connecting region CTR1, some of the dummy structure DS do not penetrate the stacked structure ST and penetrate an insulation layer 110, as shown in FIG. 5.

Referring back to FIG. 7A, the second connecting region CTR2 may include a lower dummy hole DHL and an upper dummy hole DHU penetrating through the lower stacked structure SS1 and the upper stacked structure SS2, respectively. The lower dummy hole DHL and upper dummy hole DHU formed in the second connecting region CTR2 may be referred to as a second lower dummy hole DHL2 and a second upper dummy hole DHU2, respectively.

The dummy structure DS of the second connecting region CTR2 may include at least one non-continuous portion NCP2. The non-continuous portion NCP2 may be located in a boundary region or an in-between region between the lower stacked structure SS1 and the upper stacked structure SS2. The etch stop layer ESL may be adjacent to the non-continuous portion NCP2. The etch stop layer ESL may be at substantially the same level as the non-continuous portion NCP2. For example, the non-continuous portion NCP2 may include a horizontal surface that is substantially planar and parallel to the top surface of the substrate 100, and a top surface of the etch stop layer ESL may be substantially coplanar with the top surface of this horizontal surface.

The upper portion of the non-continuous portion NCP2 may have a third diameter M3, and the lower portion of the non-continuous portion NCP2 may have a fourth diameter M4. The diameter of the non-continuous portion NCP2 at the interface between the lower stacked structure SS1 and the upper stacked structure SS2 may increase non-continuously (abruptly). Therefore, the fourth diameter M4 may be greater than the third diameter M3.

A sidewall SW2 of the dummy structure DS may have a non-continuous profile. For example, the sidewall SW2 of the dummy structure DS may have a stepped profile at the non-continuous portion NCP2. In some example embodiments, the stepped profile of the sidewall SW2 of the dummy structure DS may include a lower slanted sidewall, which is slanted with respect to the top surface of the substrate 100, a substantially horizontal upper surface, which is parallel with the top surface of the substrate 100, and an upper slanted sidewall, which is slanted with respect to the top surface of the substrate 100.

Referring back to FIG. 7B, the first connecting region CTR1 may include the lower dummy hole DHL and the upper dummy hole DHU penetrating through the lower stacked structure SS1 and the upper stacked structure SS2, respectively. The boundary line between the lower stacked structure SS1 and the upper stacked structure SS2 is indicated by a dashed line and the reference numeral 112. The lower dummy hole DHL and upper dummy hole DHU formed in the first connecting region CTR1 may be referred to as a first lower dummy hole DHL1 and a first upper dummy hole DHU1, respectively.

Unlike the dummy structure DS of the second connecting region CTR2 described above, the diameter of the dummy structure DS of the first connecting region CTR1 may have a continuous portion CPP with no non-continuous variation. The sidewall of the dummy structure DS of the first connecting region CTR1 may have a continuous profile. In some embodiments, the diameter of the dummy structure DS may gradually increase as the dummy structure DS extends in a direction away from the substrate 100, and the sidewall of the dummy structure DS of the first connecting region CTR1 may be slanted with respect to the top surface of the substrate 100.

For example, a sidewall SW3 of the dummy structure DS of the first connecting region CTR1 may not have a stepped profile. For example, the maximum diameter M3 of the first upper dummy structure DSU1 of the first connecting region CTR1 may be substantially equal to the maximum diameter M3' of the first lower dummy structure DSL1 of the first connecting region CTR1. For example, the maximum diameter M3 of the dummy structure DS of the first connecting region CTR1 may be substantially equal to the maximum diameter M3 of the dummy structure DS of the second connecting region CTR2.

Referring back to FIGS. 3, 4 and 5, on the substrate 100, a buried insulation layer 110 covering the stacked structures ST may be provided. The buried insulation layer 110 may have a planarized top surface. The vertical thickness of the buried insulation layer 110 may increase in a direction from the cell array region CAR to the connecting region CTR.

A first interlayer insulation layer 120 and a second interlayer insulation layer 130 may be disposed on the buried insulation layer 110. Bit lines BL extending lengthwise in the second direction (Y-direction) across the stacked structures ST may be arranged on the second interlayer insulation layer 130. The bit lines BL may be electrically connected to the vertical structure VS through a bit line contact plug BPLG and a bit line contact pad 111.

A first circuit line CL1 and a second circuit line CL2 connected to the contact plugs CP may be disposed on the second interlayer insulation layer 130. In one embodiment, the dummy structures DS may not be electrically connected to any of the bit lines BL, the first circuit line CL1, and the second circuit line CL2.

Figure 8:
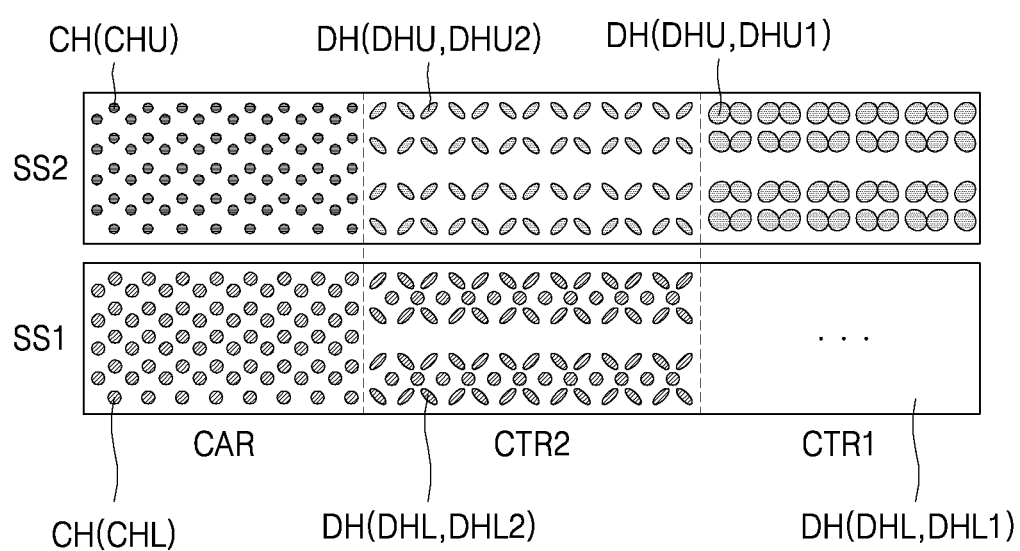
FIG. 8 is a plan layout diagram of channel holes and dummy holes of a 3-dimensional semiconductor memory device, according to an example embodiment.

FIG. 8 is a plan layout diagram of channel holes and dummy holes of a 3-dimensional semiconductor memory device according to an example embodiment.

In detail, FIG. 8 shows an example plan layout of the channel holes CH and the dummy holes DH formed in the cell array region CAR, the first connecting region CTR1, and the second connecting region CTR2 of the 3-dimensional semiconductor memory device 10 of FIGS. 3 to 7. The numbers of channel holes CH and dummy holes DH formed in the cell array region CAR, the first connecting region CTR1, and the second connecting region CTR2 are merely examples, and the inventive concept is not limited thereto. Vertical structures (VS in FIGS. 3 to 7) and dummy structures (DS in FIGS. 3 to 7) may be formed in the channel holes CH and the dummy holes DH.

The plan layout diagrams of FIG. 8 may correspond to the surface pattern shape of the channel holes CH and the dummy holes DH in a given stacked structure. In some embodiments, the surface pattern shape may reflect a cross-sectional shape of the channel holes CH and dummy holes DH upon formation of a given stacked structure, when viewed from a top-down direction. For example, the surface pattern shape of the lower stacked structure SS1 shows the layout and cross-sectional appearance of the channel holes CH and the dummy holes DH when the channel holes CH and the dummy holes DH lower are formed in the lower stacked structure SS1 and before the second stacked structure SS2 is formed. Likewise, the surface pattern shape of the upper stacked structure SS2 shows the layout and cross-sectional appearance of the channel holes CH and the dummy holes DH when the channel holes CH and the dummy holes DH are formed in the upper stacked structure SS2. Thus, for example, the dummy holes DH in the first connecting region CTR1 are not shown in the surface pattern shape of the lower stacked structure SS1 because these dummy holes are not formed until the upper stacked structure SS2 is formed.

In some embodiments, the surface pattern shape of the lower channel hole CHL formed in the lower stacked structure SS1 in the cell array region CAR may be identical to the surface pattern shape of the upper channel hole CHU formed in the upper stacked structure SS2. The surface pattern shape of the lower channel hole CHL and the upper channel hole CHU may be circular or elliptical. The diameter of the lower channel hole CHL may be greater than the diameter of the upper channel hole CHU.

In some embodiments, the surface pattern shape of the dummy hole DH formed in the second connecting region CTR2 may be different from the surface pattern shape of the dummy hole DH formed in the first connecting region CTR1. Each of the dummy holes DH formed in the second connecting region CTR2 and the first connecting region CTR1 may include a plurality of sub-holes. Each of the dummy holes DH formed in the second connecting region CTR2 and the first connecting region CTR1 may include a plurality of sub-holes including circular sub-holes, elliptical sub-holes, or a combination thereof.

In some embodiments, the dummy holes DH may include the lower dummy hole DHL penetrating through the lower stacked structure SS1 and the upper dummy hole DHU penetrating through the upper stacked structure SS2. The surface pattern shape of the lower dummy hole DHL may be different from the surface pattern shape of the upper dummy hole DHU.

In some embodiments, the surface pattern shape of the second lower dummy hole DHL2 penetrating through the lower stacked structure SS1 of the second connecting region CTR2 may be different from the surface pattern shape of the second upper dummy hole DHU2 penetrating through the upper stacked structure SS2 of the second connecting region CTR2.

In some embodiments, the surface pattern shape of the second lower dummy hole DHL2 penetrating through the lower stacked structure SS1 of the second connecting region CTR2 may be different from the surface pattern shape of the first upper dummy hole DHU1 penetrating through an insulating layer (e.g., insulating layer 110 of FIGS. 4 and 5) of the first connecting region CTR1.

In some embodiments, the surface pattern shape of the second upper dummy hole DHU2 penetrating through the upper stacked structure SS2 of the second connecting region CTR2 may be different from the surface pattern shape of the first upper dummy hole DHU1 penetrating through an insulating layer (e.g., insulating layer 110 of FIGS. 4 and 5) of the first connecting region CTR1.

In some embodiments, the surface pattern shape of the first upper dummy hole DHU1 penetrating through an insulating layer (e.g., insulating layer 110 of FIGS. 4 and 5) of the second connecting region CTR2 may be different from the surface pattern shape of the first lower dummy hole DHL1 penetrating through the lower stacked structure SS1 of the first connecting region CTR1.

As described above, according to the inventive concept, the surface pattern shapes of the channel holes CH and the dummy holes DH formed in the cell array region CAR, the first connecting region CTR1, and the second connecting region CTR2 may be variously formed, thereby improving integration and the freedom of design and fabricating reliable 3-dimensional semiconductor memory devices.

In addition, according to the inventive concept, the dummy holes DH formed in the second connecting region CTR2 and the first connecting region CTR1 are variously formed, thereby fabricating reliable 3-dimensional semiconductor memory devices having a high freedom of design.

FIGS. 9 to 15 are cross-sectional views showing a method of fabricating a 3-dimensional semiconductor memory device, according to an example embodiment.

In detail, FIGS. 9 to 15 are cross-sectional views taken along a line II-II' of FIG. 3 and illustrate a method of fabricating the 3-dimensional semiconductor memory device shown in FIG. 5.

Figure 9:
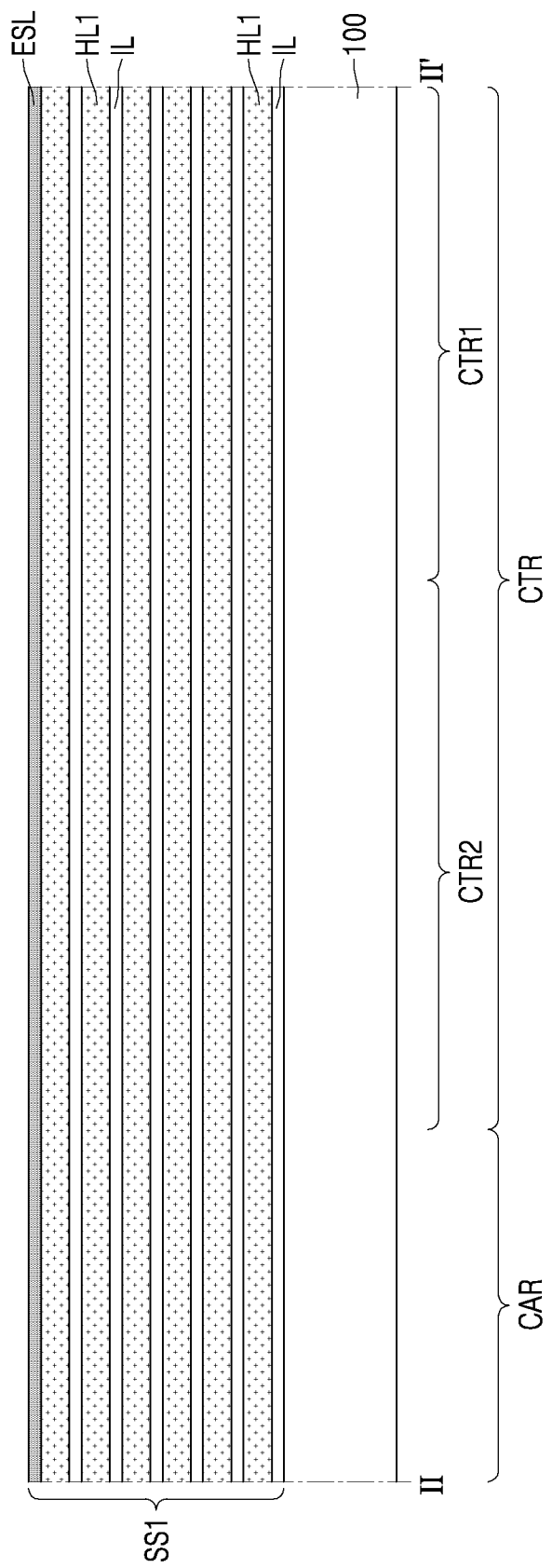
FIGS. 9 to 15 are cross-sectional views showing a method of fabricating a 3-dimensional semiconductor memory device, according to an example embodiment.

First, referring to FIG. 9, the insulation layers IL and first sacrificial layers HL1 are vertically and alternately stacked on the surface of the substrate 100, thereby forming the lower stacked structure SS1. The insulation layers IL and the first sacrificial layers HL1 may be referred to as lower mold layers. The substrate 100 may include the cell array region CAR and the connecting regions CTR. In an embodiment, the substrate 100 may be a silicon substrate, a germanium substrate, or a silicon-germanium substrate.

The connecting regions CTR may include the second connecting region CTR2 adjacent to the cell array region CAR and the first connecting region CTR1 adjacent to the second connecting region CTR2. For example, the second connecting region CTR2 may be horizontally adjacent to the cell array region CAR and between the cell array region CAR and the first connecting region CTR1. The etch stop layer ESL may be formed on the topmost first sacrificial layer HL1. The etch stop layer ESL may be formed only when desired and, in some embodiments, may be omitted.

The insulation layers IL, the first sacrificial layers HL1, and the etch stop layer ESL may be formed through a thermal chemical vapor deposition (CVD) process, a plasma-enhanced CVD process, a physical CVD process, or an atomic layer deposition (ALD) process. The insulation layers IL may include silicon oxide films, and the first sacrificial layers HL1 may include silicon nitride films or silicon oxynitride films. The etch stop layer ESL may include a polysilicon film.

Figure 10:
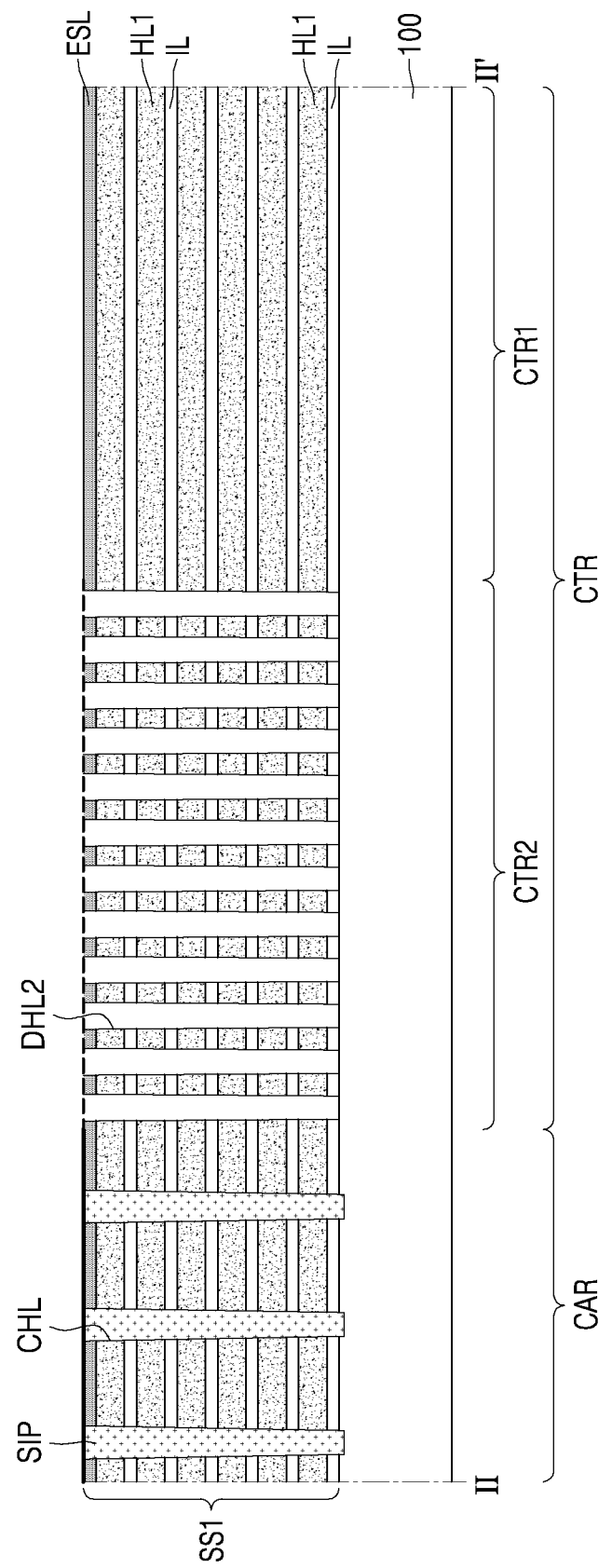

Referring to FIG. 10, lower channel holes CHL are formed on the cell array region CAR through the lower stacked structure SS1 to expose the substrate 100. The diameter of a lower channel hole CHL may gradually decrease as a distance to the substrate 100 decreases. For example, the diameter of the lower channel hole CHL may be smaller near the substrate 100 and greater near the etch stop layer ESL.

An operation for forming the lower channel holes CHL may include an operation for forming mask patterns including openings that define regions to form the lower channel holes CHL on the lower stacked structure SS1 and an operation for etching the lower stacked structure SS1 by using the mask patterns as an etch mask.

Thereafter, the mask patterns may be removed. During the operation for etching the lower stacked structure SS1, the top surface of the substrate 100 may over-etched. Therefore, the top portion of the substrate 100 may be recessed in region below the lower channel holes CHL.

Sacrificial insulation patterns SIP filling the lower channel holes CHL may be formed. An operation for forming the sacrificial insulation patterns SIP may include an operation for forming a sacrificial insulating layer filling the lower channel holes CHL on the lower stacked structure SS1 and an operation for planarizing the sacrificial insulating layer until the top surface of the etch stop layer ESL is exposed.

In addition, the second lower dummy holes DHL2 penetrating through the lower stacked structure SS1 of the second connecting region CTR2 may be formed. The diameter of the second lower dummy hole DHL2 may gradually decrease as the distance to the substrate 100 decreases. For example, the diameter of the second lower dummy hole DHL2 may be smaller near the substrate 100 and greater near the etch stop layer ESL. The formation of the second lower dummy holes DHL2 may be substantially similar to the formation of the lower channel holes CHL described above. In some embodiments, the second lower dummy holes DHL2 may be filled with the sacrificial insulation patterns SIP.

In one example embodiment, the operation for forming the lower channel holes CHL and the operation for forming the second lower dummy holes DHL2 may be performed simultaneously. In some embodiments, the operation for forming the lower channel holes CHL and the operation for forming the second lower dummy holes DHL2 may be performed separately.

Figure 11:
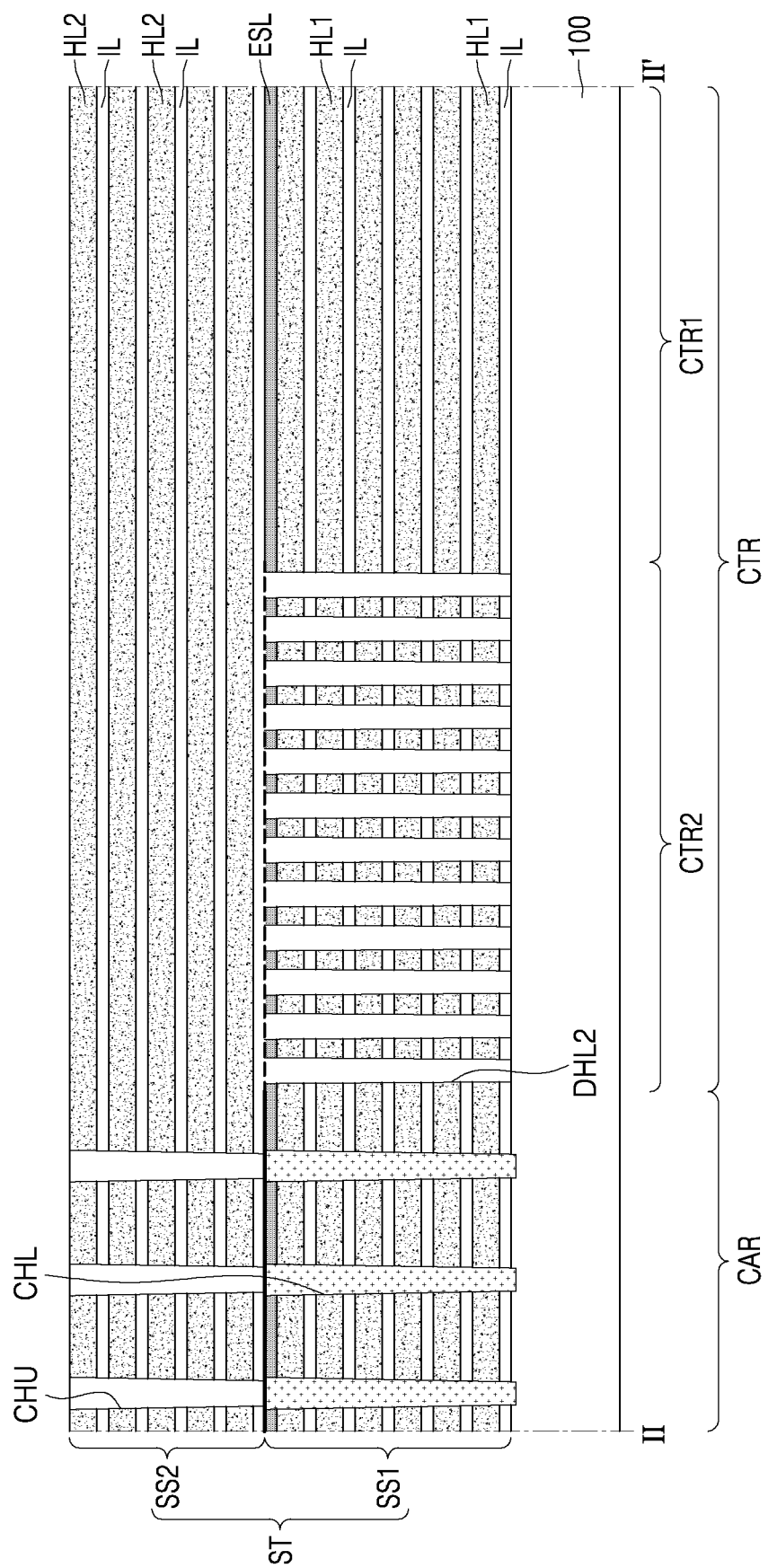

Referring to FIG. 11, the upper stacked structure SS2 may be formed by vertically and alternately stacking the insulation layers IL and second sacrificial layers HL2 on the lower stacked structure SS1. The insulation layers IL and the second sacrificial layers HL2 may be referred to as upper mold layers. The lower stacked structure SS1 and the upper stacked structure SS2 may constitute the stacked structure ST. The insulation layers IL and the second sacrificial layers HL2 may be formed through operations substantially the same as those described above in relation to the lower stacked structure SS1.

The upper channel holes CHU may be formed on the cell array region CAR to penetrate through the upper stacked structure SS2 and expose the sacrificial insulation patterns SIP. The diameter of an upper channel hole CHU may gradually decrease as a distance to the substrate 100 decreases. For example, the diameter of the upper channel hole CHU may be smaller nearer to the substrate 100 and greater farther away from the substrate 100. The upper channel holes CHU may be formed to vertically overlap the lower channel holes CHL.

The operation for forming the upper channel holes CHU may be the same as the operation for forming the lower channel holes CHL described above. For example, when the upper channel holes CHU are formed, misalignment with the lower channel holes CHL may occur. In this case, the etch stop layer ESL may prevent the lower stacked structure SS1 from being etched.

During formation of the upper channel hole CHU, the sacrificial insulation patterns SIP exposed through the upper channel holes CHU may be selectively removed. As a result, the lower channel hole CHL and the upper channel hole CHU communicate with each other and constitute one channel hole (CH in FIG. 3).

Since the lower channel holes CHL and the upper channel holes CHU are formed in different operations, the diameter of the channel hole CH may change non-continuously. For example, the diameter of the channel hole CH at the interface region or the boundary region between the lower stacked structure SS1 and the upper stacked structure SS2 may increase non-continuously (abruptly). The sidewall of the channel hole CH may have a non-continuous profile (i.e., a stepped profile).

Figure 12:
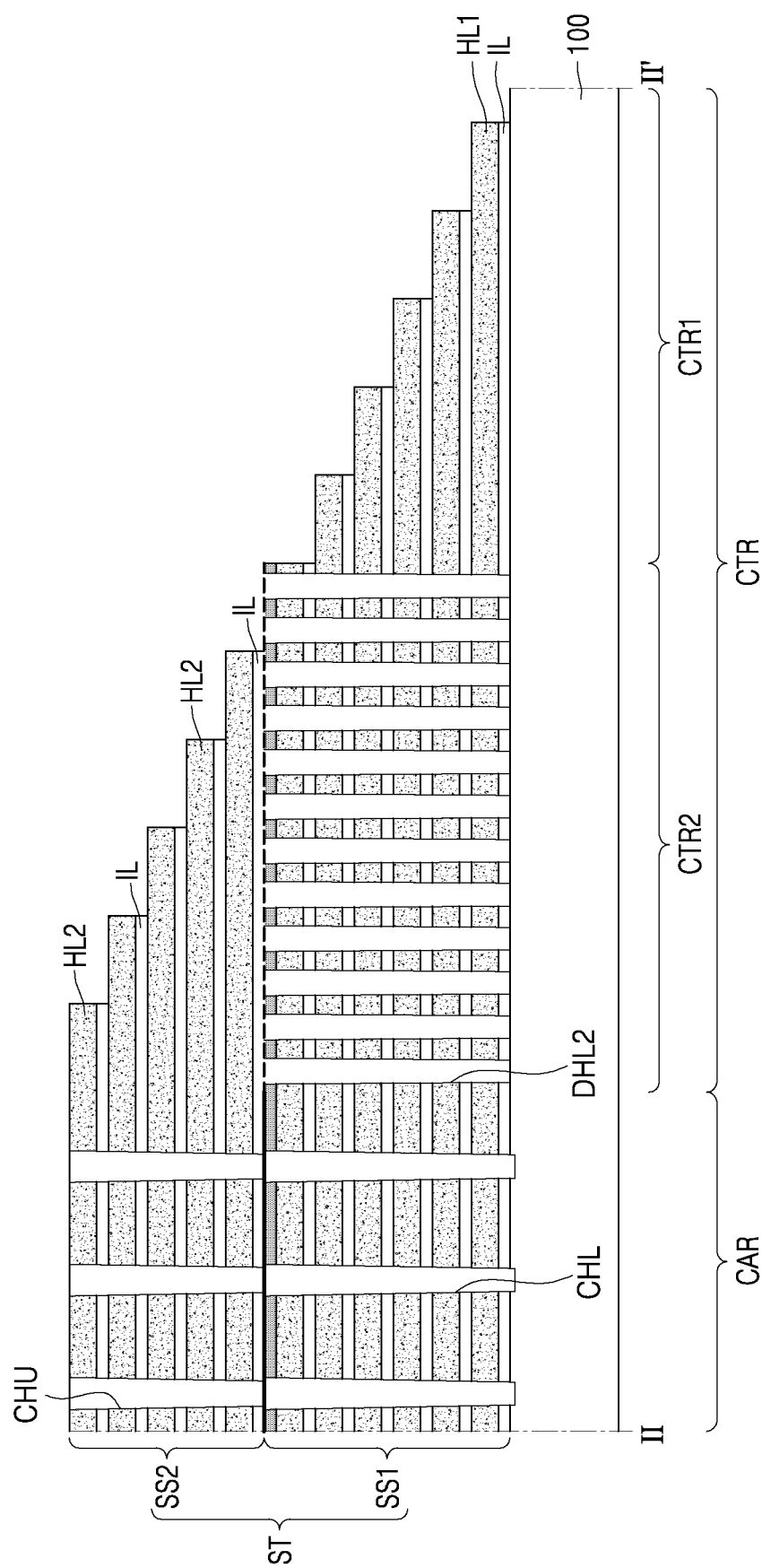

Referring to FIG. 12, a stepped structure may be formed in the stacked structure ST on the connecting region CTR. The stepped structure may be formed by repeatedly performing an operation for forming mask patterns on the stacked structure ST, an operation for etching a portion of the stacked structure ST by using the mask patterns as an etch mask, and a trimming operation for reducing the size of the mask patterns.

The operation for etching a portion of the stacked structure ST may include etching a plurality of sacrificial layers HL1 and HL2 exposed by the mask patterns. The trimming operation may be an operation for reducing the area of a mask pattern by horizontally moving a sidewall of the mask pattern by a certain distance.

Figure 13:
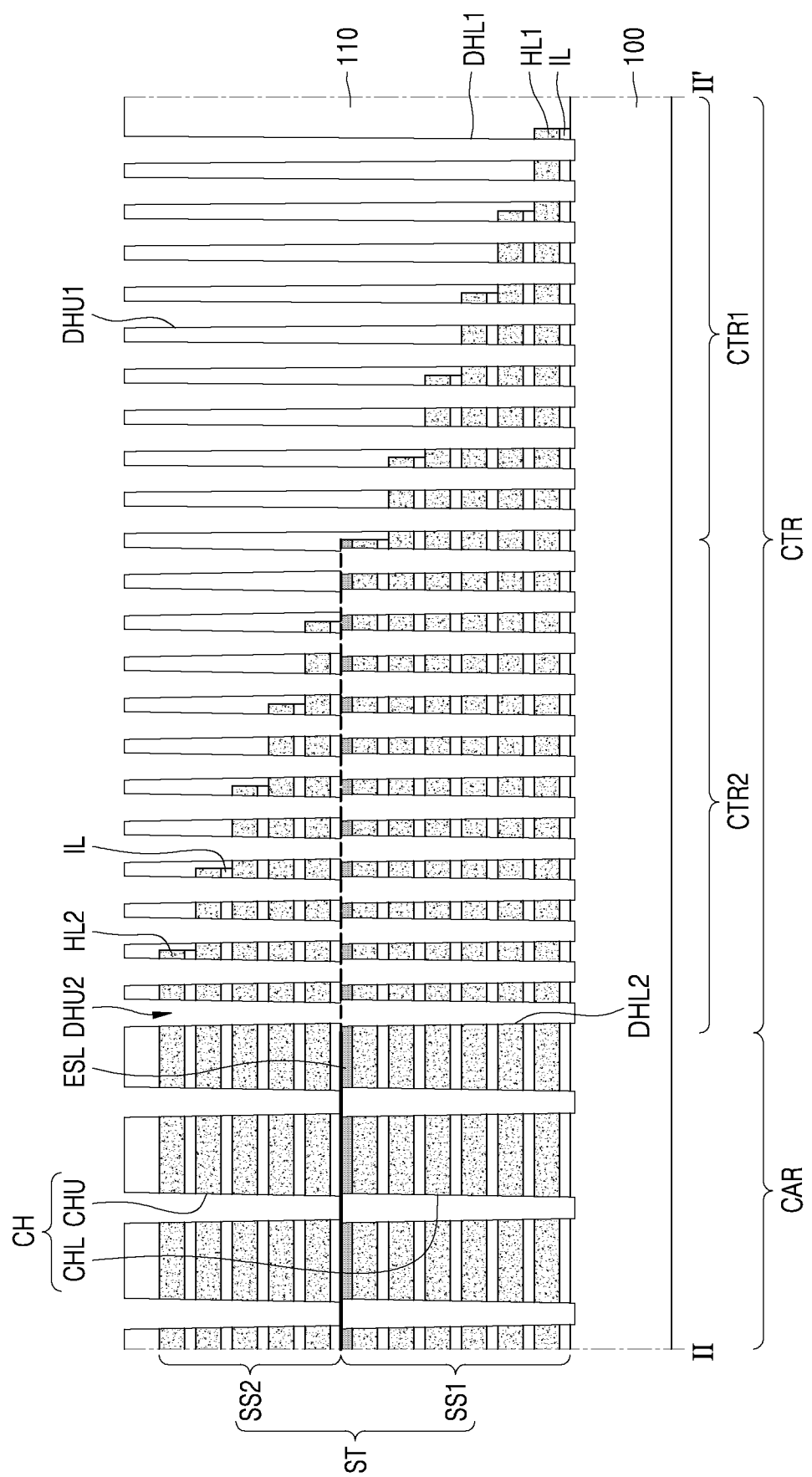

Referring to FIG. 13, the buried insulation layer 110 covering the stacked structure ST may be formed on the top surface of the substrate 100. The second upper dummy holes DHU2 penetrating through the upper stacked structure SS2 and the buried insulation layer 110 in the second connecting region CTR2 and the first upper dummy hole DHU1 and the first lower dummy hole DHL1 penetrating through the lower stacked structure SS1 and the buried insulation layer 110 in the first connecting region CTR1 may be formed.

The diameters of the second upper dummy hole DHU2, the first upper dummy hole DHU1, and the first lower dummy hole DHL1 may gradually decrease as distances to the substrate 100 decrease. The formations of the second upper dummy hole DHU2, the first upper dummy hole DHU1, and the first lower dummy hole DHL1 may be substantially similar to the formation of the channel holes CH described above.

The second upper dummy hole DHU2, the first upper dummy hole DHU1, and the first lower dummy hole DHL1 may be formed through the same operation. In one example embodiment, since the first upper dummy hole DHU1 and the first lower dummy hole DHL1 are formed through the same operation, the diameters of the first upper dummy hole DHU1 and the first lower dummy hole DHL1 may continuously change.

For example, the diameters of the first upper dummy hole DHU1 and the first lower dummy hole DHL1 in the interfacial region or the boundary region between the lower stacked structure SS1 and the upper stacked structure SS2 may change continuously. Inner sidewalls of the first upper dummy hole DHU1 and the first lower dummy hole DHL1 may have continuous profiles.

In one embodiment, since the second upper dummy hole DHU2 and the second lower dummy hole DHL2 are formed through different operations, the diameters of the second upper dummy hole DHU2 and the second lower dummy hole DHL2 may change non-continuously.

For example, the diameter of the second upper dummy hole DHU2 and the second lower dummy hole DHL2 at the interface region or the boundary region between the lower stacked structure SS1 and the upper stacked structure SS2 may increase non-continuously (abruptly). Inner sidewalls of the second upper dummy hole DHU2 and the second lower dummy hole DHL2 may have non-continuous profiles (i.e., a stepped profile).

Figure 14:
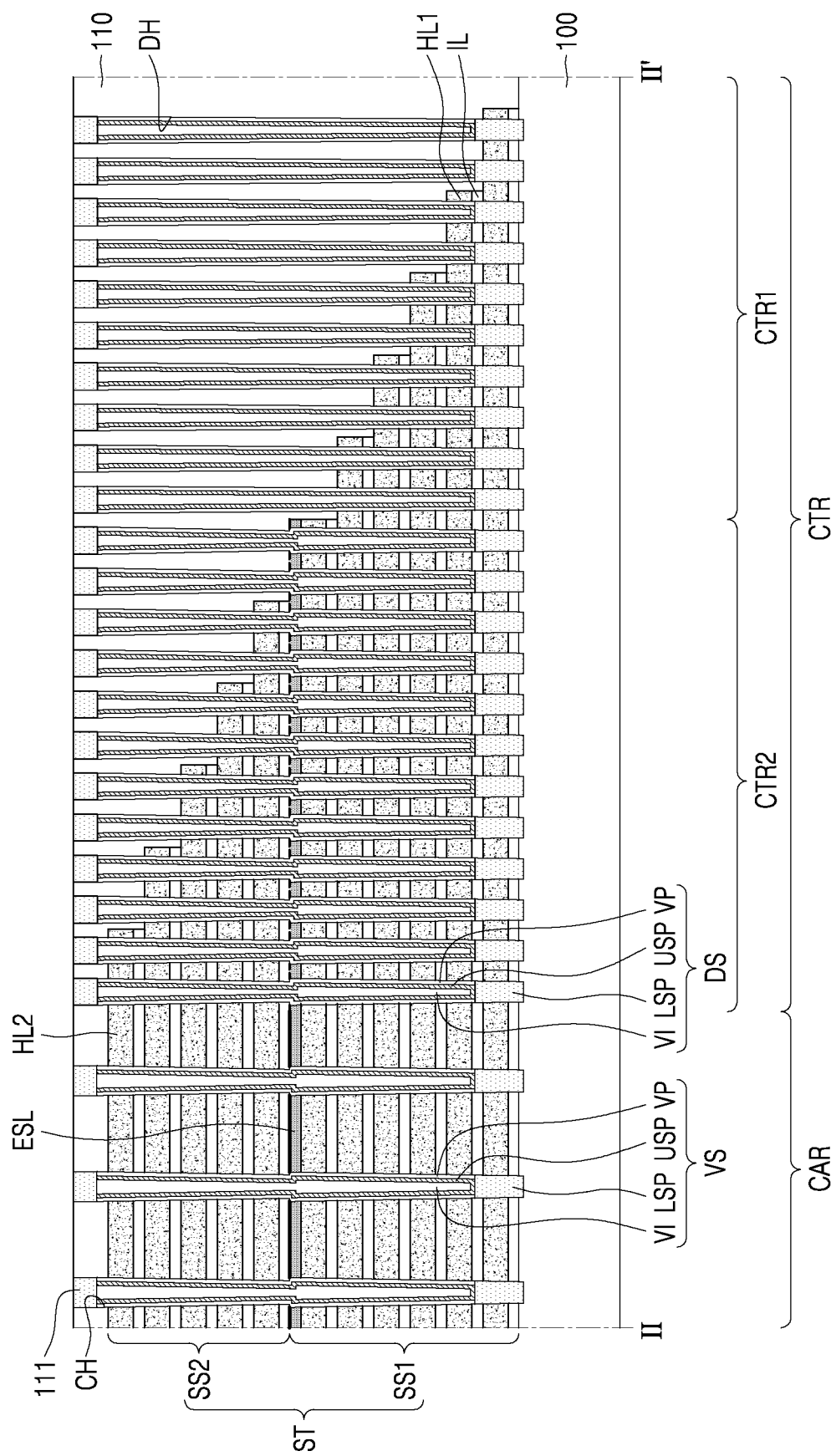

Referring to FIG. 14, the vertical structures VS may be formed in the channel holes CH, and the dummy structures DS may be formed in the dummy holes DH. In the present embodiment, the vertical structures VS and the dummy structures DS may be formed simultaneously.

In detail, the lower semiconductor patterns LSP may be formed on portions of the substrate 100 exposed through the channel holes CH and the dummy holes DH. The lower semiconductor patterns LSPs may fill the lower portions of the channel holes CH and the dummy holes DH. The lower semiconductor patterns LSP may be formed through a selective epitaxial growth operation using the portions of the substrate 100 exposed through the channel holes CH and the dummy holes DH as a seed layer.

The vertical insulation layer VP and the upper semiconductor pattern USP sequentially covering the inner walls of the channel holes CH and the dummy holes DH may be formed. Each of the vertical insulation layer VP and the upper semiconductor pattern USP may be formed through an ALD process or a CVD process. Next, the buried insulation pattern VI completely filling the channel holes CH and the dummy holes DH may be formed.

Figure 15:
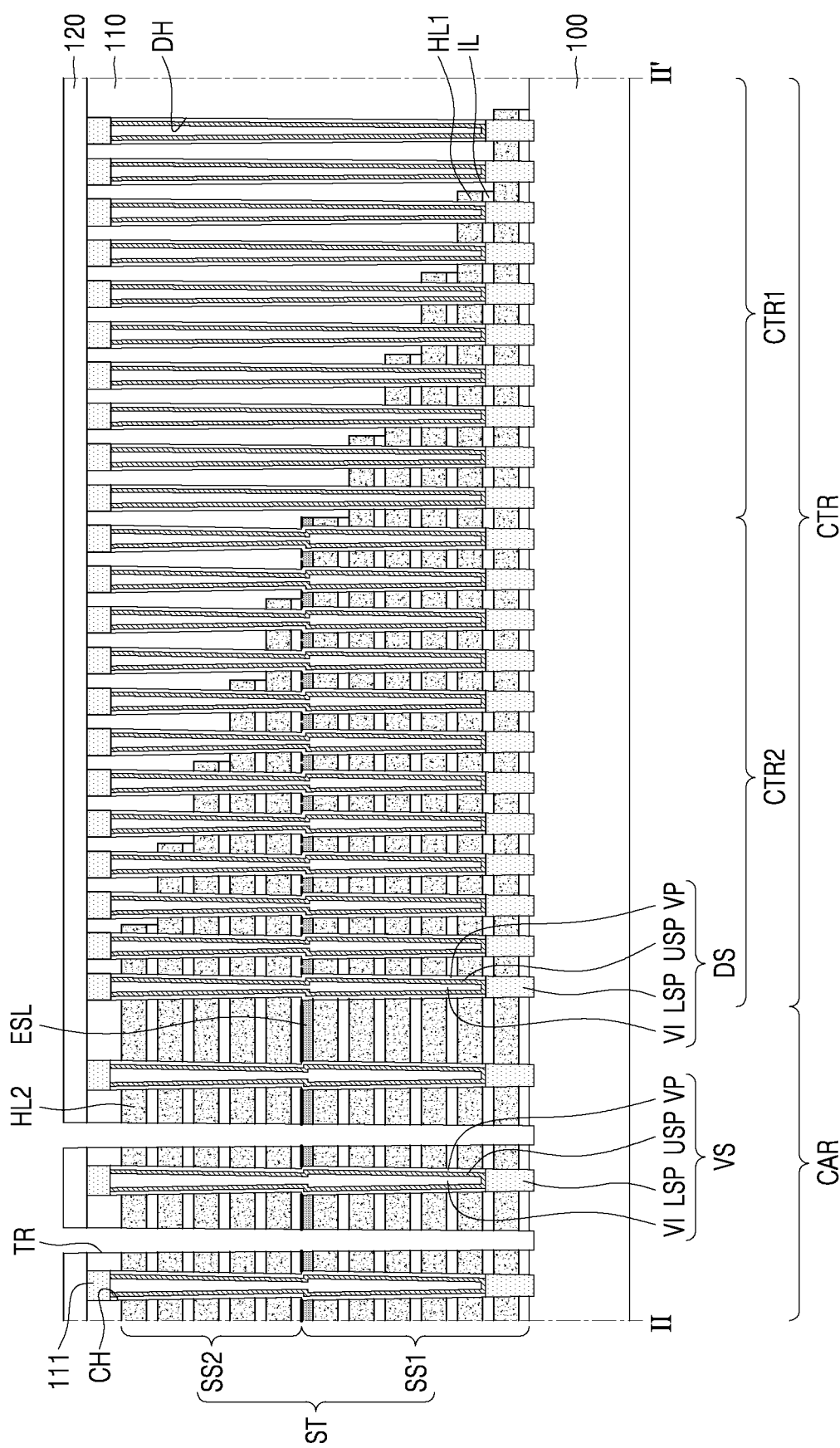

Referring to FIG. 15, the first interlayer insulation layer 120 may be formed on the buried insulation layer 110. The stacked structures ST horizontally apart from one another may be formed by patterning the stacked structure ST. The stacked structures ST may be arranged in the second direction (Y-direction) while extending in the first direction (X-direction).

Trenches TR may be defined between the stacked structures ST adjacent to each other. The trenches TR may expose portions of the substrate 100. The trenches TR may extend in the first direction (X-direction) along the stacked structures ST.

Referring back to FIGS. 4 and 5, the first and second sacrificial layers HL1 and HL2 may be replaced by the electrodes EL. In detail, the first and second sacrificial layers HL1 and HL2 exposed through the trenches TR are selectively removed, and the electrodes EL may be formed in spaces from which the first and second sacrificial layers HL1 and HL2 are removed.

In one example embodiment, the operation for replacing the first and second sacrificial layers HL1 and HL2 with the electrodes EL may be performed after the fabrication process of FIG. 12. For example, as shown in FIG. 12, the first and second sacrificial layers HL1 and HL2 exposed through the lower channel hole CHL, the upper channel hole CHU, and the second lower dummy hole DHL2 may be selectively removed, and the electrodes EL may be formed in the spaces from which the first and second sacrificial layers HL1 and HL2 are removed.

The common source regions CSR may be formed by doping portions of the substrate 100 exposed through the trenches TR. The insulation spacers SP and the common source plugs CSP sequentially filling the trenches TR may be formed. The common source plugs CSP may be connected to the common source regions CSR.

The second interlayer insulation layer 130 may be formed on the first interlayer insulation layer 120. Bit line contact plugs BPLG that penetrate through the first interlayer insulation layer 120 and the second interlayer insulation layer 130 and are connected to the vertical structures VS may be formed. The contact plugs CP that penetrate through the first interlayer insulation layer 120, the second interlayer insulation layer 130, through the buried insulation layer 110 and are connected to the electrodes EL may be formed. Each of the contact plugs CP may have substantially vertical sidewalls continuously extending from the top surface of the second interlayer insulation layer 130 to the electrode EL to which the contact plug CP is connected.

The bit lines BL electrically connected to the bit line contact plugs BPLG and the first and second circuit lines CL1 and CL2 electrically connected to the contact plugs CP may be formed on the second interlayer insulation layer 130.

According to the example method of fabricating a 3-dimensional semiconductor memory device, according to example embodiments, the lower stacked structure SS1 and the lower channel holes CHL may be formed, and then the upper stacked structure SS2 and the upper channel holes CHU may be formed. One channel hole CH formed as the lower channel hole CHL and the upper channel hole CHU communicate with each other may completely penetrate through the stacked structure ST having a large number of layers. As a result, both the integration and the reliability of a 3-dimensional semiconductor memory device may be improved.

In the example method of fabricating a 3-dimensional semiconductor memory device, according to the inventive concept, the second lower dummy hole DHL2 is formed in the second connecting region CTR2 during the formation of the lower channel hole CHL. In addition, according to the example method of fabricating a 3-dimensional semiconductor memory device, according to the inventive concept, after the upper stacked structure SS2 is formed, the second upper dummy hole DHU2 may be formed in the second connecting region CTR2 and the first lower dummy hole DHL1 and the first upper dummy hole DHU1 may be formed in the first connecting region CTR1 through one etching operation.

Through the fabrication process as described above, the second lower dummy hole DHL2, the second upper dummy hole DHU2, the first lower dummy hole DHL1, and the first upper dummy hole DHU1 may have various surface pattern shapes, and thus the freedom of design may be improved.

The example method of fabricating a 3-dimensional semiconductor memory device, according to the inventive concept, may simplify a fabrication process by forming the lower stacked structure SS1 and the upper stacked structure SS2 and then forming a stepped structure on the connecting region CTR at once.

Figure 16:
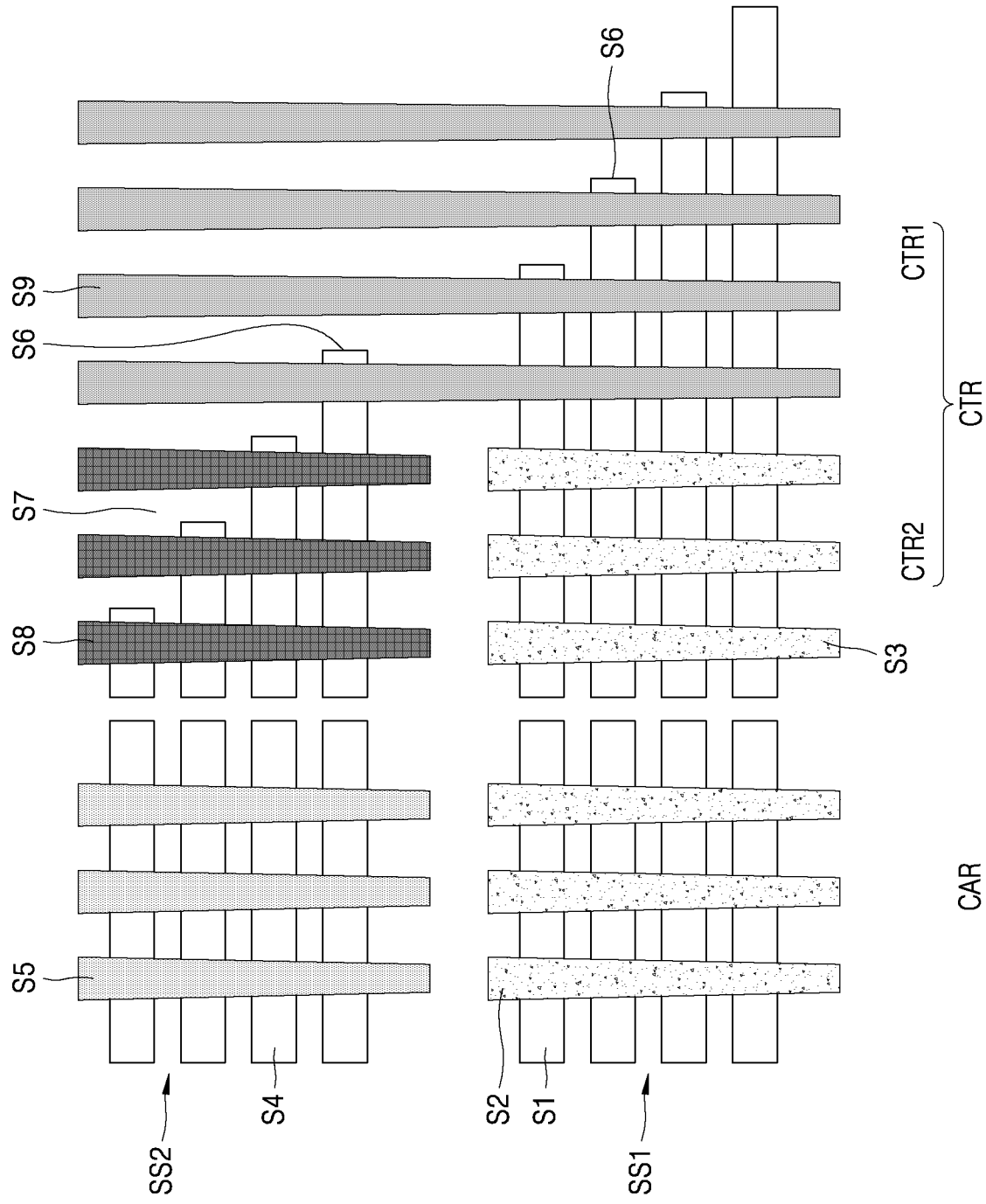
FIG. 16 is a conceptual diagram for describing a sequence of fabricating a 3-dimensional semiconductor memory device, according to an example embodiment.

FIG. 16 is a conceptual diagram for describing a sequence of fabricating a 3-dimensional semiconductor memory device according to an example embodiment.

In detail, FIG. 16 may include a sequence of fabricating the 3-dimensional semiconductor memory device described above with reference to FIGS. 3 to 15. In the description of FIG. 16, the same reference numerals as those in FIGS. 3 to 15 denote the same elements.

First, a lower mold layer is formed on the cell array region CAR and the connecting region CTR to form the lower stacked structure SS1 (operation S1). The lower mold layer may be a structure in which insulation layers IL and first sacrificial layers HL1 described above are stacked.

Subsequently, an operation for forming the lower channel hole CHL through the lower stacked structure SS1 of the cell array region CAR is performed (operation S2). Subsequently, an operation for forming the second lower dummy hole DHL2 through the lower stacked structure SS1 of the second connecting region CTR2 is performed (operation S3). Operation S2 for forming the lower channel hole CHL and operation S3 for forming the second lower dummy hole DHL2 may be performed simultaneously.

Next, an operation for forming an upper mold layer on the cell array region CAR and the connecting region CTR to form the upper stacked structure SS2 is performed (operation S4). The upper mold layer may be a structure in which insulation layers IL and second sacrificial layers HL2 described above are stacked. Subsequently, an operation for forming the upper channel hole CHU through the upper stacked structure SS2 of the cell array region CAR is performed (operation S5).

Subsequently, an operation for forming a stepped structure by patterning one side of the lower stacked structure SS1 and one side of the upper stacked structure SS2 in the connecting region CTR is performed (operation S6). When desired, an operation for replacing the first sacrificial layer HL1 and the second sacrificial layer HL2 included in the lower mold layer and the upper mold layer with the electrodes EL may be performed.

Next, an operation for forming the buried insulation layer 110 covering the upper stacked structure SS2 and the lower stacked structure SS1 of the cell array region CAR and the connecting region CTR is formed (operation S7).

Subsequently, an operation for forming the second upper dummy hole DHU2 penetrating through the upper stacked structure SS2 of the second connecting region CTR2 is performed (operation S8). Subsequently, an operation for forming the first upper dummy hole DHU1 and the first lower dummy hole DHL1 penetrating through the insulation layer 110 and the and the lower stacked structure SS1 of the first connecting region CTR1 is performed (operation S9). Operation S8 for forming the second upper dummy hole DHU2 and operation S9 for forming the first upper dummy hole DHU1 and the first lower dummy hole DHL1 may be performed simultaneously.

Figure 17:
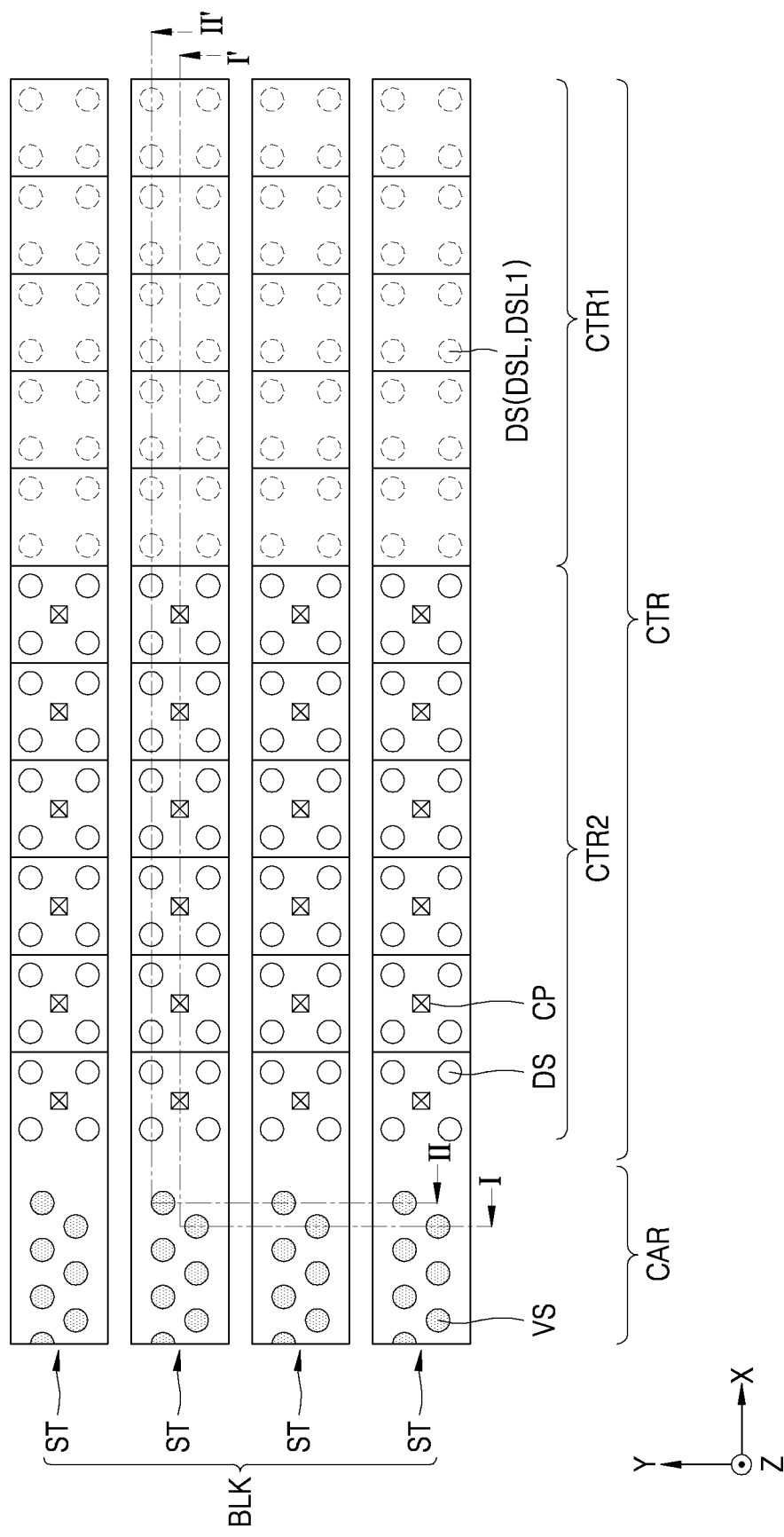
FIG. 17 is a layout diagram of a 3-dimensional semiconductor memory device, according to an example embodiment.
Figure 18:
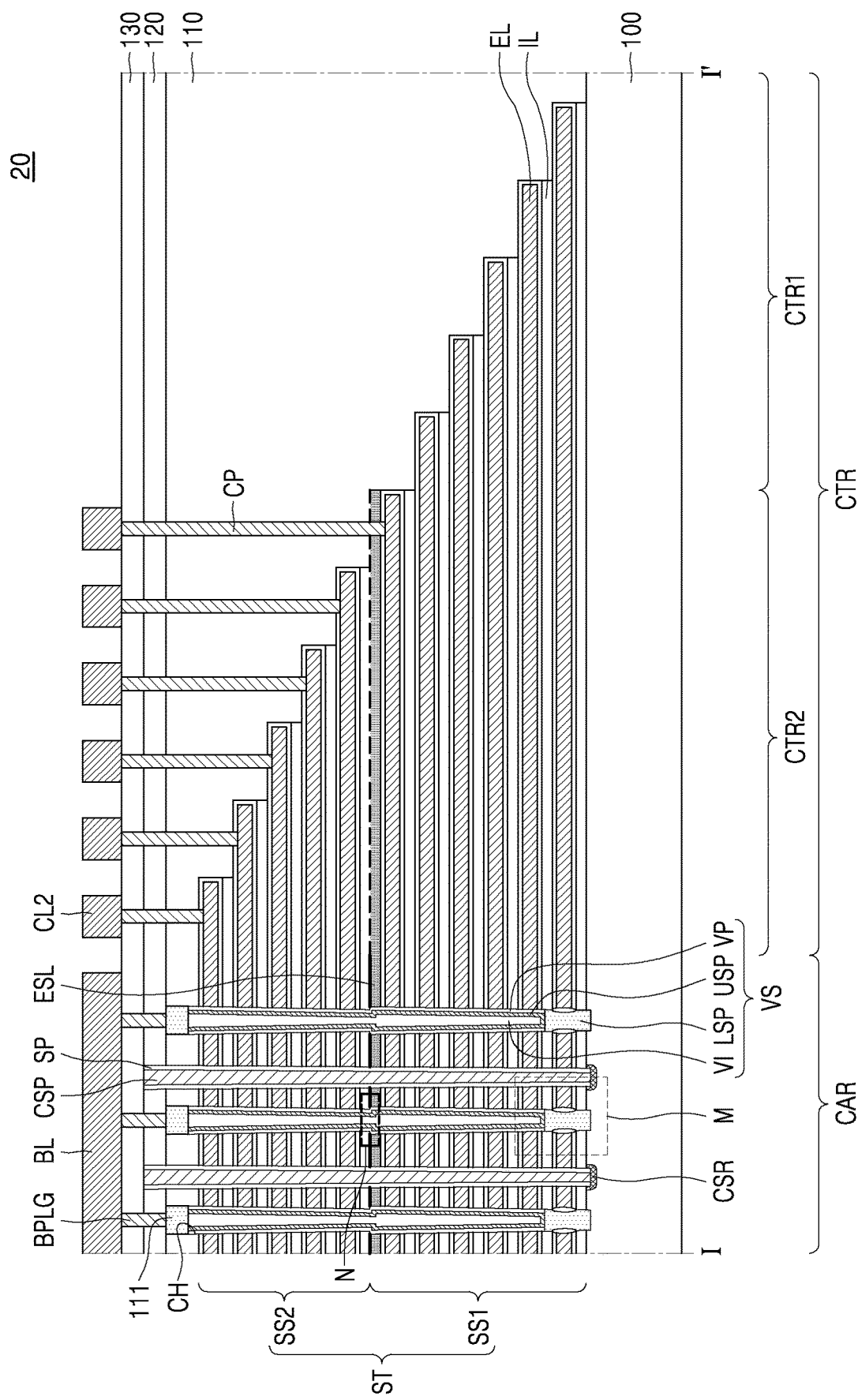
FIGS. 18 and 19 are cross-sectional views taken along lines I-I' and II-II' of FIG. 17, respectively.
Figure 19:
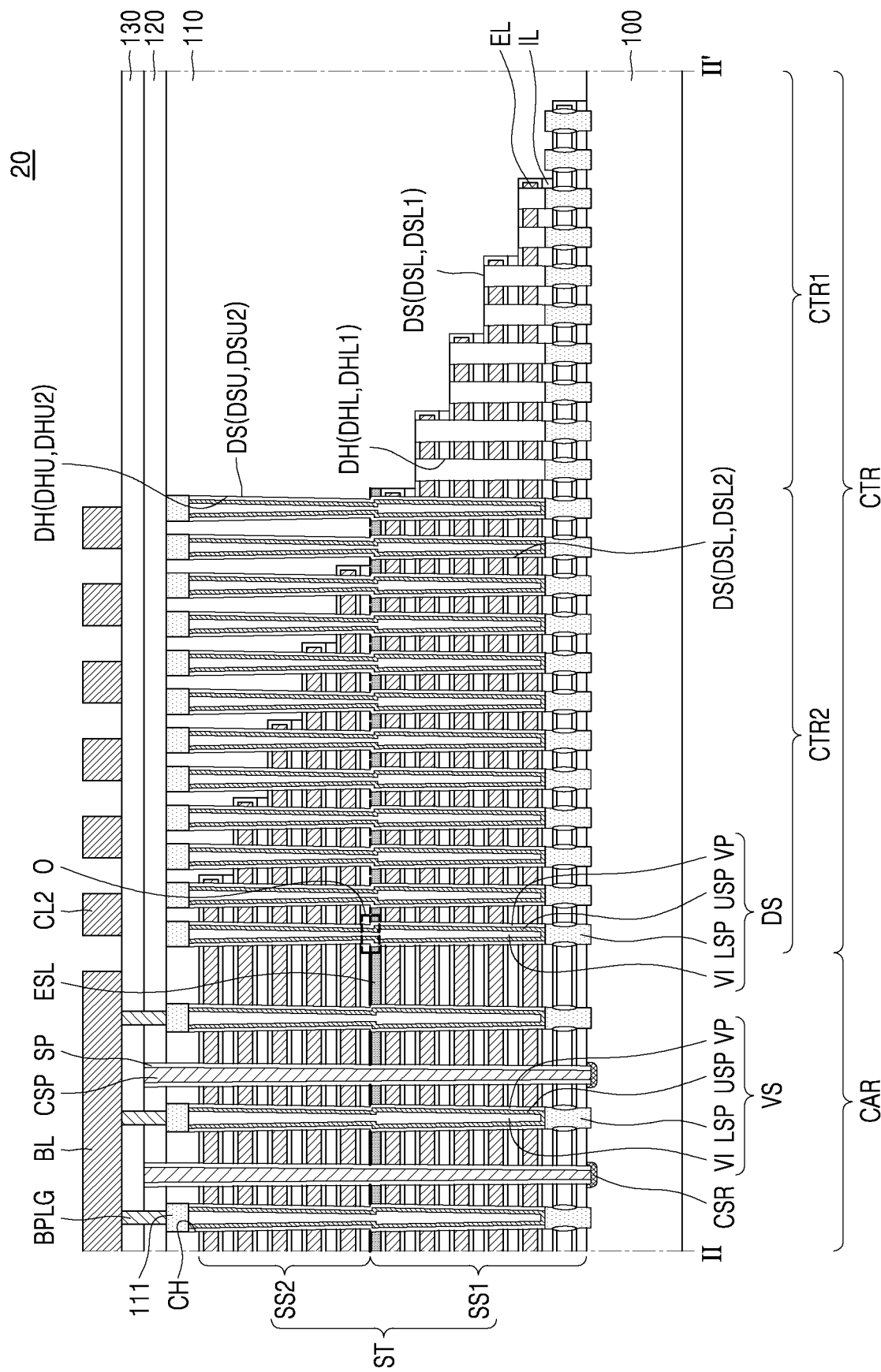

FIG. 17 is a layout diagram of a 3-dimensional semiconductor memory device according to an example embodiment. FIGS. 18 and 19 are cross-sectional views taken along lines I-I' and II-II' of FIG. 17, respectively.

In detail, a 3-dimensional semiconductor memory device 20 of FIGS. 17 to 19 may be identical to the 3-dimensional semiconductor memory device 10 of FIGS. 3 to 7 except for the buried insulation layer 110 formed in the first connecting region CTR1 without the contact plugs CP. The M region and the N region in FIG. 18 may be identical to those shown in FIGS. 6A and 6B, respectively. The O region in FIG. 19 is identical to that shown in FIG. 7A, and thus the detailed description thereof will be omitted.

In FIGS. 17 to 19, descriptions identical to those given above with reference to FIGS. 3 to 7 will be briefly given or omitted. In FIGS. 17 to 19, the same reference numerals as in FIGS. 3 to 7 denote the same elements.

As shown in FIGS. 17 to 19, no contact plug CP is formed in the first connecting region CTR1 of the connecting region CTR. As shown in FIG. 17, only a first lower dummy structure DSL1 may be formed in the first connecting region CTR1.

As shown in FIGS. 18 and 19, a second upper dummy structure DSU2 and a second lower dummy structure DSL2 may be formed in the second connecting region CTR2. Furthermore, the first lower dummy structure DSL1 may be formed in the first connecting region CTR1.

The first lower dummy structure DSL1 may include the buried insulation layer 110 unlike the cell array region CAR and the second connecting region CTR2. Only the buried insulation layer 110 may be formed in the first connecting region CTR1 without forming the upper stacked structure SS2.

The 3-dimensional semiconductor memory device 20 of FIGS. 17 to 19 may be formed with the connecting region CTR having various structures, such that the upper stacked structure SS2 is not formed in the first connecting region CTR1. Therefore, the freedom of design may be improved.

Figure 20:
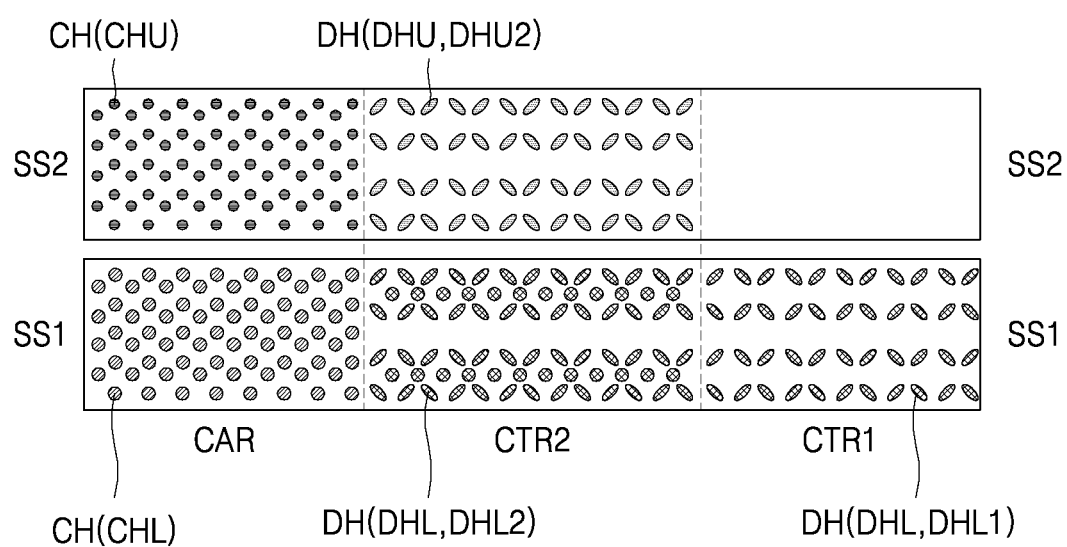
FIG. 20 is a plan layout diagram of channel holes and dummy holes of a 3-dimensional semiconductor memory device, according to an example embodiment.

FIG. 20 is a plan layout diagram of channel holes and dummy holes of a 3-dimensional semiconductor memory device according to an example embodiment.

In detail, FIG. 20 shows an example plan layout of the channel holes CH and the dummy holes DH formed in the cell array region CAR, the first connecting region CTR1, and the second connecting region CTR2 of the 3-dimensional semiconductor memory device 20 of FIGS. 17 to 19. In FIG. 20, descriptions identical to those given above with reference to FIG. 8 will be briefly given or omitted.

The numbers of channel holes CH and the dummy holes DH formed in the cell array region CAR, the first connecting region CTR1, and the second connecting region CTR2 are merely examples, and the inventive concept is not limited thereto. Vertical structures (e.g., vertical structures VS in FIGS. 17 to 19) and dummy structures (e.g., dummy structures DS in FIGS. 17 to 19) may be formed in the channel holes CH and the dummy holes DH.

In some embodiments, the surface pattern shape of the lower channel hole CHL formed in the lower stacked structure SS1 in the cell array region CAR may be identical to the surface pattern shape of the upper channel hole CHU formed in the upper stacked structure SS2.

In some embodiments, the dummy holes DH may include the lower dummy hole DHL penetrating through the lower stacked structure SS1 and the upper dummy hole DHU penetrating through the upper stacked structure SS2. The surface pattern shape of the lower dummy hole DHL may be different from the surface pattern shape of the upper dummy hole DHU.

In some embodiments, the surface pattern shape of the lower channel hole CHL formed in the lower stacked structure SS1 in the cell array region CAR may be identical to the surface pattern shape of the upper channel hole CHU formed in the upper stacked structure SS2. The surface pattern shape of the lower channel hole CHL and the upper channel hole CHU may be circular or elliptical. The diameter of the lower channel hole CHL may be greater than the diameter of the upper channel hole CHU.

In some embodiments, the surface pattern shape of the first lower dummy hole DHL1 penetrating through the lower stacked structure SS1 of the first connecting region CTR1 may be different from the surface pattern shape of the second upper dummy hole DHU2 penetrating through the upper stacked structure SS2 of the second connecting region CTR2.

In some embodiments, the surface pattern shape of the second lower dummy hole DHL2 penetrating through the lower stacked structure SS1 of the second connecting region CTR2 and the surface pattern shape of the first lower dummy hole DHL1 penetrating through the lower stacked structure SS1 of the first connecting region CTR1 may be differently from the surface pattern shape of the second upper dummy hole DHU2 penetrating through the upper stacked structure SS2 of the second connecting region CTR2.

In some embodiments, the surface pattern shape of the second lower dummy hole DHL2 penetrating through the lower stacked structure SS1 of the second connecting region CTR2 may be different from the surface pattern shape of the first lower dummy hole DHL1 penetrating through the lower stacked structure SS1 of the first connecting region CTR1.

In some embodiments, the second lower dummy hole DHL2 penetrating through the lower stacked structure SS1 and the second upper dummy hole DHU2 penetrating through the upper stacked structure SS2 may be formed in the second connecting region CTR2. The first lower dummy hole DHL1 penetrating through the lower stacked structure SS1 and the buried insulation layer (e.g., buried insulation layer 110 of FIGS. 18 and 19) covering the lower stacked structure SS1 including the first lower dummy hole DHL1 may be formed in the first connecting region CTR1.

As described above, according to the inventive concept, the dummy holes DH formed in the second connecting region CTR2 and the first connecting region CTR1 are variously formed, thereby fabricating reliable 3-dimensional semiconductor memory devices.

FIGS. 21 to 26 are cross-sectional views for describing a method of fabricating a 3-dimensional semiconductor memory device, according to an example embodiment.

In detail, FIGS. 21 to 26 are cross-sectional views taken along a line II-II' of FIG. 17 and a method of fabricating the 3-dimensional semiconductor memory device shown in FIG. 19. In FIGS. 21 to 26, the same reference numerals as in FIGS. 9 to 15 denote the same elements, and detailed description thereof will be briefly given or omitted.

First, as described above with reference to FIG. 9, the insulation layers IL and first sacrificial layers HL1 are vertically and alternately stacked on the surface of the substrate 100, thereby forming the lower stacked structure SS1. The insulation layers IL and the first sacrificial layers HL1 may be referred to as lower mold layers. The substrate 100 may include the cell array region CAR and the connecting regions CTR.

The connecting regions CTR may include the second connecting region CTR2 horizontally adjacent to the cell array region CAR and the first connecting region CTR1 horizontally adjacent to the second connecting region CTR2. The etch stop layer ESL may be formed on the topmost first sacrificial layer HL1. The etch stop layer ESL may be formed only when desired and, in some embodiments, may be omitted.

Figure 21:
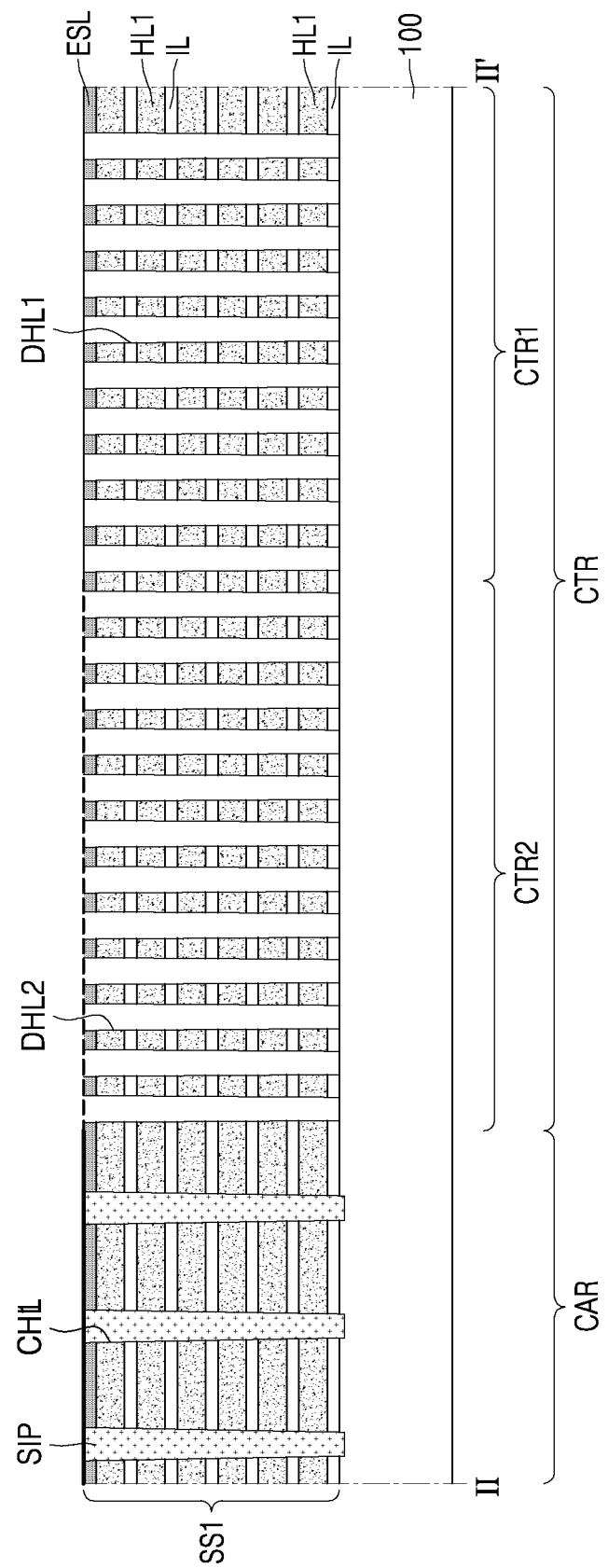
FIGS. 21 to 26 are cross-sectional views for describing a method of fabricating a 3-dimensional semiconductor memory device, according to an example embodiment.

Referring to FIG. 21, lower channel holes CHL that penetrate through the lower stacked structure SS1 and expose the substrate 100 are formed on the cell array region CAR. Sacrificial insulation patterns SIP filling the lower channel holes CHL may be formed.

In addition, the second lower dummy holes DHL2 penetrating through the lower stacked structure SS1 of the second connecting region CTR2 may be formed. The first lower dummy holes DHL1 penetrating through the lower stacked structure SS1 of the first connecting region CTR1 may be formed. The diameters of the second lower dummy holes DHL2 and second lower dummy holes DHL1 may gradually decrease as distances to the substrate 100 decrease.

In one embodiment, the operation for forming the lower channel holes CHL, the operation for forming the second lower dummy holes DHL2, and the operation for forming the first lower dummy holes DHL1 may be performed simultaneously. In some embodiments, the operation for forming the lower channel holes CHL, the operation for forming the second lower dummy holes DHL2, and the operation for forming the first lower dummy holes DHL1 may be performed separately. In some embodiments, the operation for forming the lower dummy holes DHL2 and the operation for forming the first lower dummy holes DHL1 may be performed separately.

Figure 22:
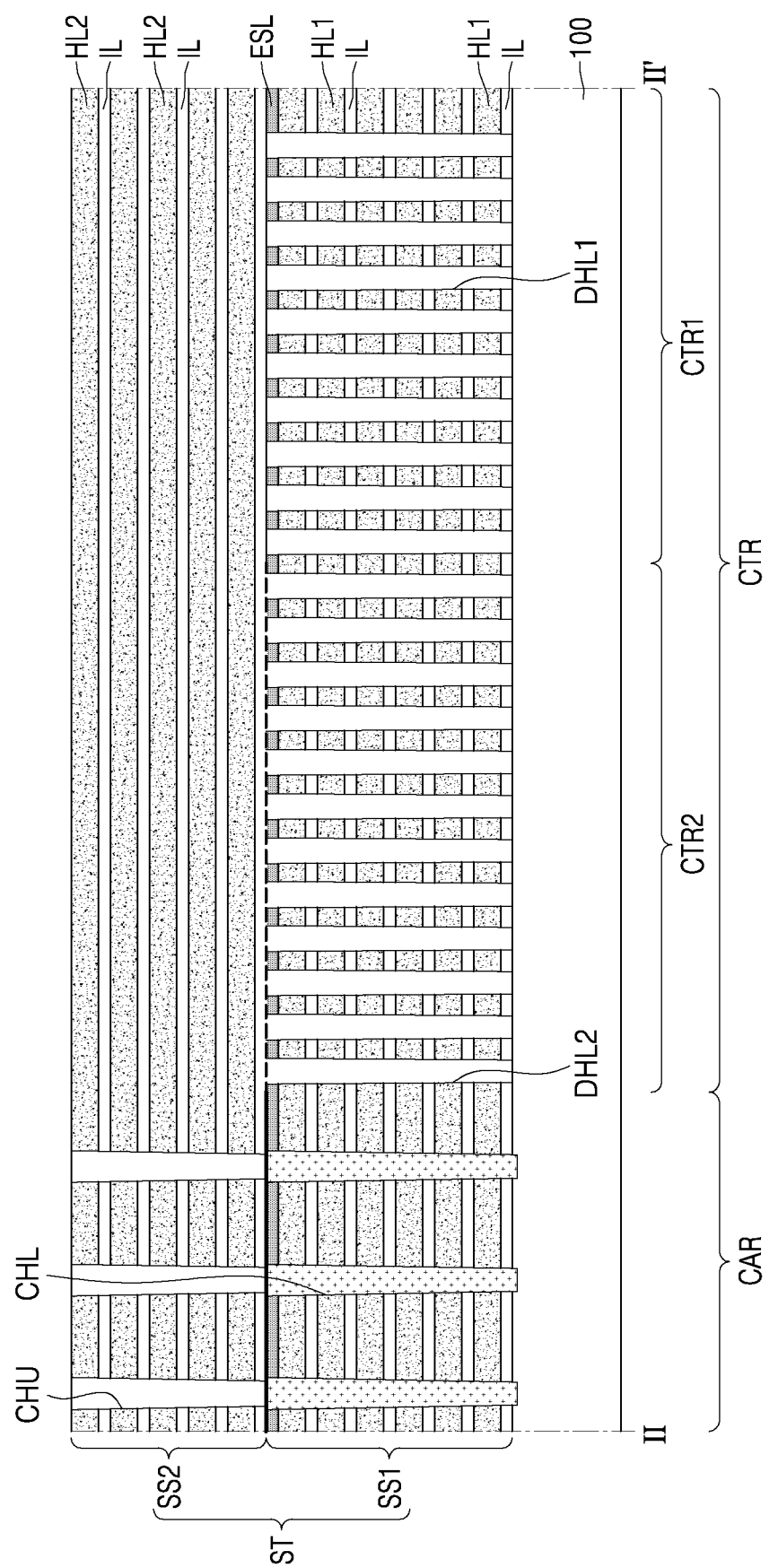

Referring to FIG. 22, the upper stacked structure SS2 may be formed by vertically and alternately stacking the insulation layers IL and second sacrificial layers HL2 on the lower stacked structure SS1. The insulation layers IL and the second sacrificial layers HL2 may be referred to as upper mold layers. The lower stacked structure SS1 and the upper stacked structure SS2 may constitute the stacked structure ST.

The upper channel holes CHU may be formed on the cell array region CAR to penetrate through the upper stacked structure SS2 and expose the sacrificial insulation patterns SIP. The diameter of an upper channel hole CHU may gradually decrease as a distance to the substrate 100 decreases. The upper channel holes CHU may be formed to vertically overlap the lower channel holes CHL.

The operation for forming the upper channel holes CHU may be the same as the operation for forming the lower channel holes CHL described above. During formation of the upper channel hole CHU, the sacrificial insulation patterns SIP exposed through the upper channel holes CHU may be selectively removed. As a result, the lower channel hole CHL and the upper channel hole CHU communicate with each other and constitute one channel hole (e.g., channel hole CH in FIG. 19).

Since the lower channel holes CHL and the upper channel holes CHU are formed in different operations, the diameter of the channel hole CH may change non-continuously. For example, the diameter of the channel hole CH at the interface region or the boundary region between the lower stacked structure SS1 and the upper stacked structure SS2 may increase non-continuously (abruptly). The sidewall of the channel hole CH may have a non-continuous profile (i.e., a stepped profile).

Figure 23:
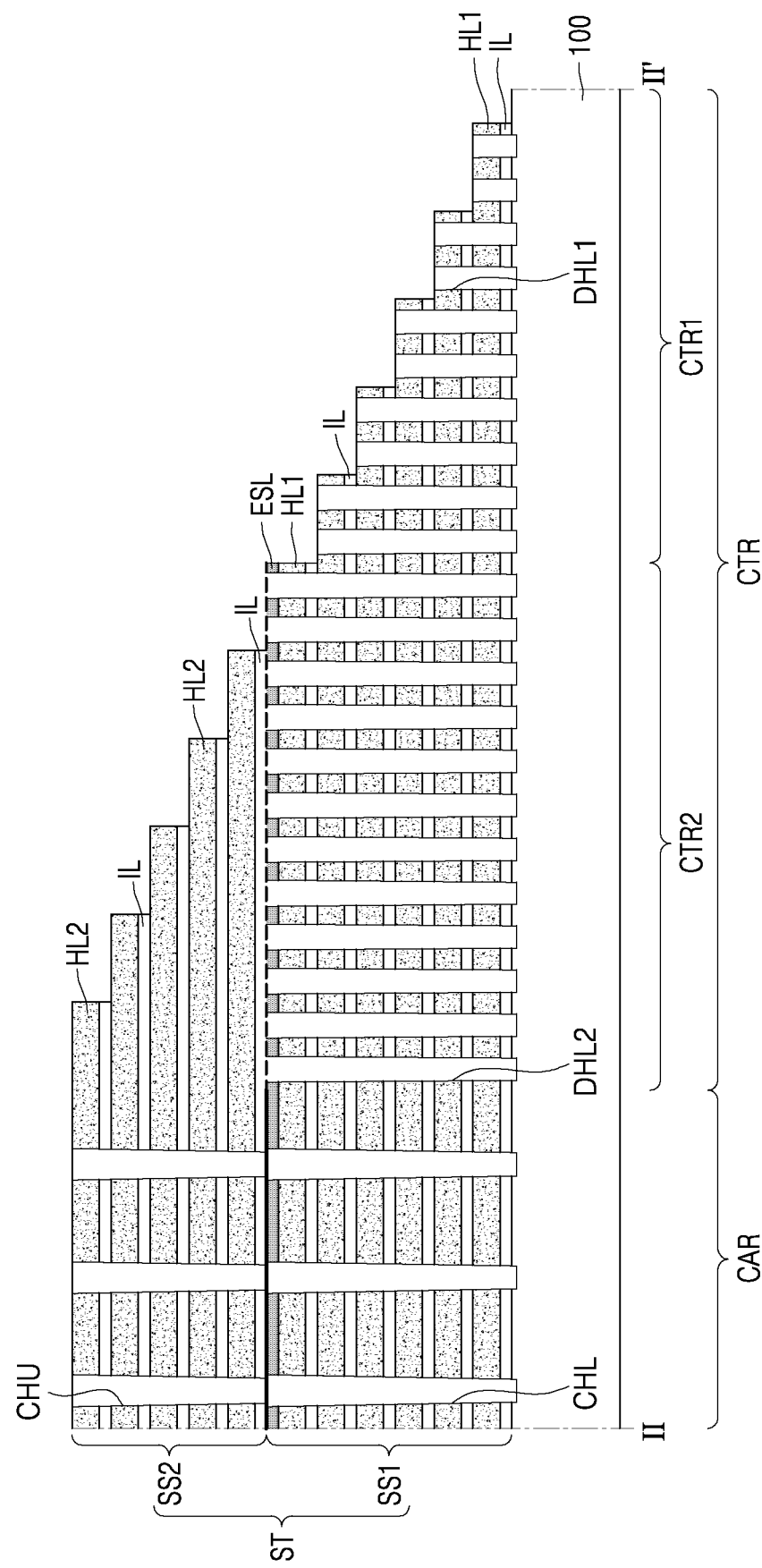

Referring to FIG. 23, a stepped structure may be formed in the stacked structure ST on the connecting region CTR. The stepped structure may be formed by repeatedly performing an operation for forming mask patterns on the stacked structure ST, an operation for etching a portion of the stacked structure ST by using the mask patterns as an etch mask, and a trimming operation for reducing the size of the mask patterns.

The operation for etching a portion of the stacked structure ST may include etching a plurality of sacrificial layers HL1 and HL2 exposed by the mask patterns. The trimming operation may be an operation for reducing the area of a mask pattern by horizontally moving a sidewall of the mask pattern by a certain distance.

Figure 24:
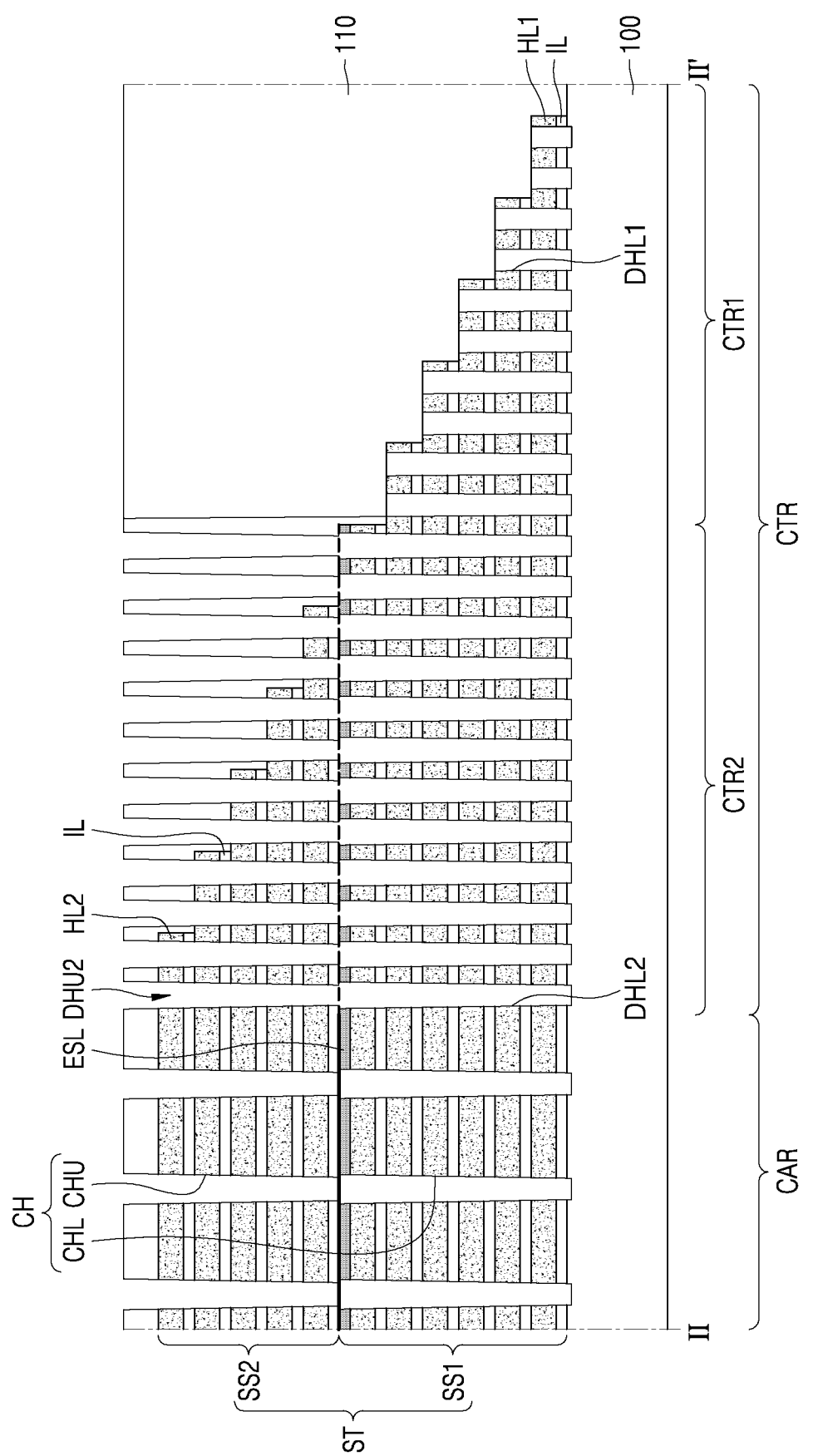

Referring to FIG. 24, the buried insulation layer 110 covering the stacked structure ST may be formed on the top surface of the substrate 100. The second upper dummy hole DHU2 penetrating through the upper stacked structure SS2 of the second connecting region CTR2 and the buried insulation layer 110 may be formed.

The diameter of the second upper dummy hole DHU2 may gradually decrease as the distance to the substrate 100 decreases. The formation of the second upper dummy holes DHU2 may be substantially similar to the formation of the channel holes CH described above.

In some embodiments, since the second upper dummy hole DHU2 and the second lower dummy hole DHL2 are formed through different operations, the diameters of the second upper dummy hole DHU2 and the second lower dummy hole DHL2 may change non-continuously.

For example, the diameter of the second upper dummy hole DHU2 and the second lower dummy hole DHL2 at the interface region or the boundary region between the lower stacked structure SS1 and the upper stacked structure SS2 may increase non-continuously (abruptly). Inner sidewalls of the second upper dummy hole DHU2 and the second lower dummy hole DHL2 may have non-continuous profiles (i.e., a stepped profile).

Figure 25:
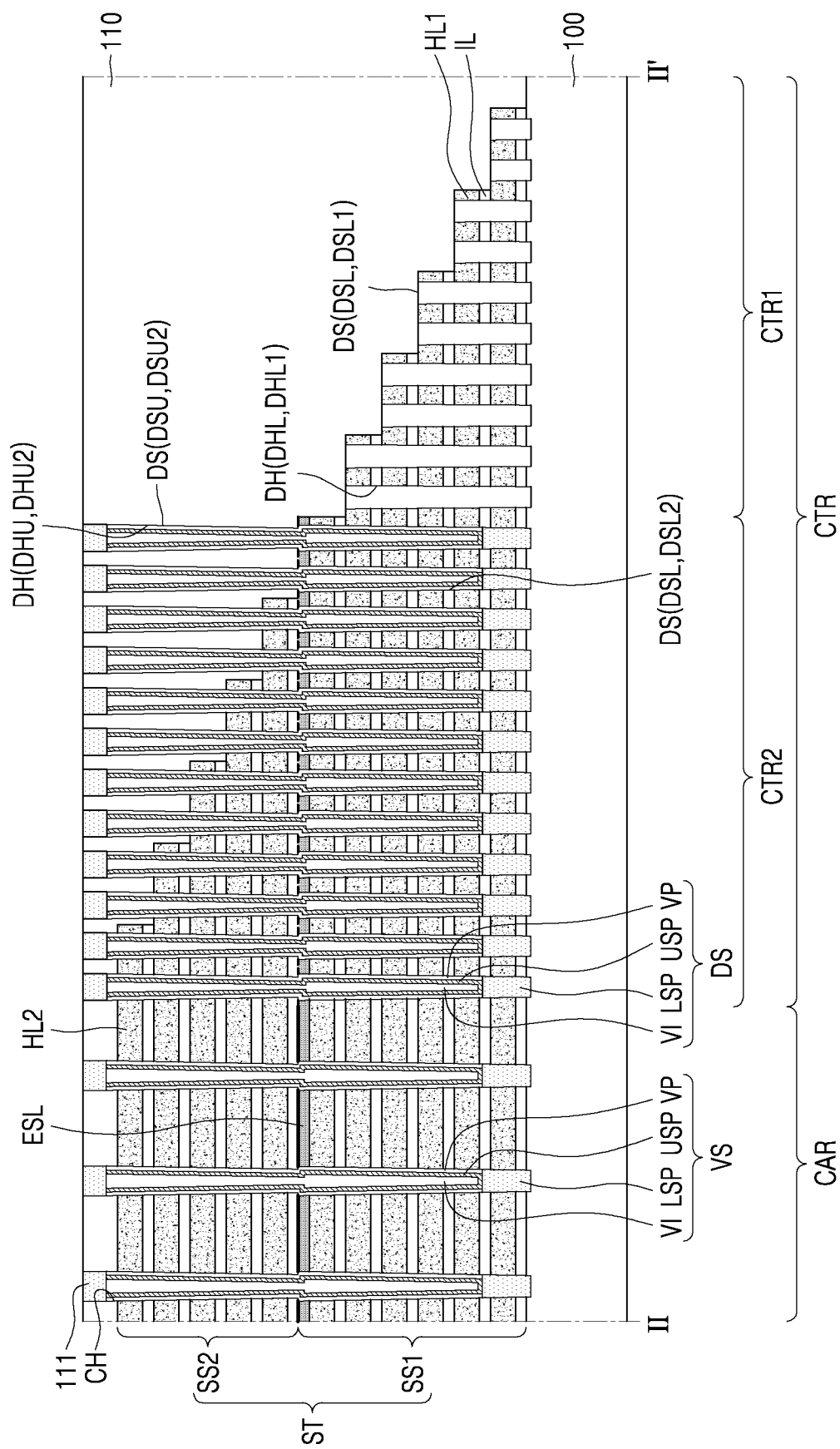

Referring to FIG. 25, the vertical structures VS may be formed in the channel holes CH. The dummy structures DS may be formed in the second lower dummy hole DHL2 and the second upper dummy holes DH2. The dummy structure DS may include a lower dummy structure DSL and an upper dummy structure DSU.

The second lower dummy structure DSL2 and the second upper dummy structure DSU2 may be formed in the second lower dummy hole DHL2 and the second upper dummy holes DHL2, respectively. The first lower dummy structure DSL1 may be formed in the first lower dummy hole DHL1. In the present embodiment, the vertical structures VS and the dummy structures DS may be formed simultaneously.

Figure 26:
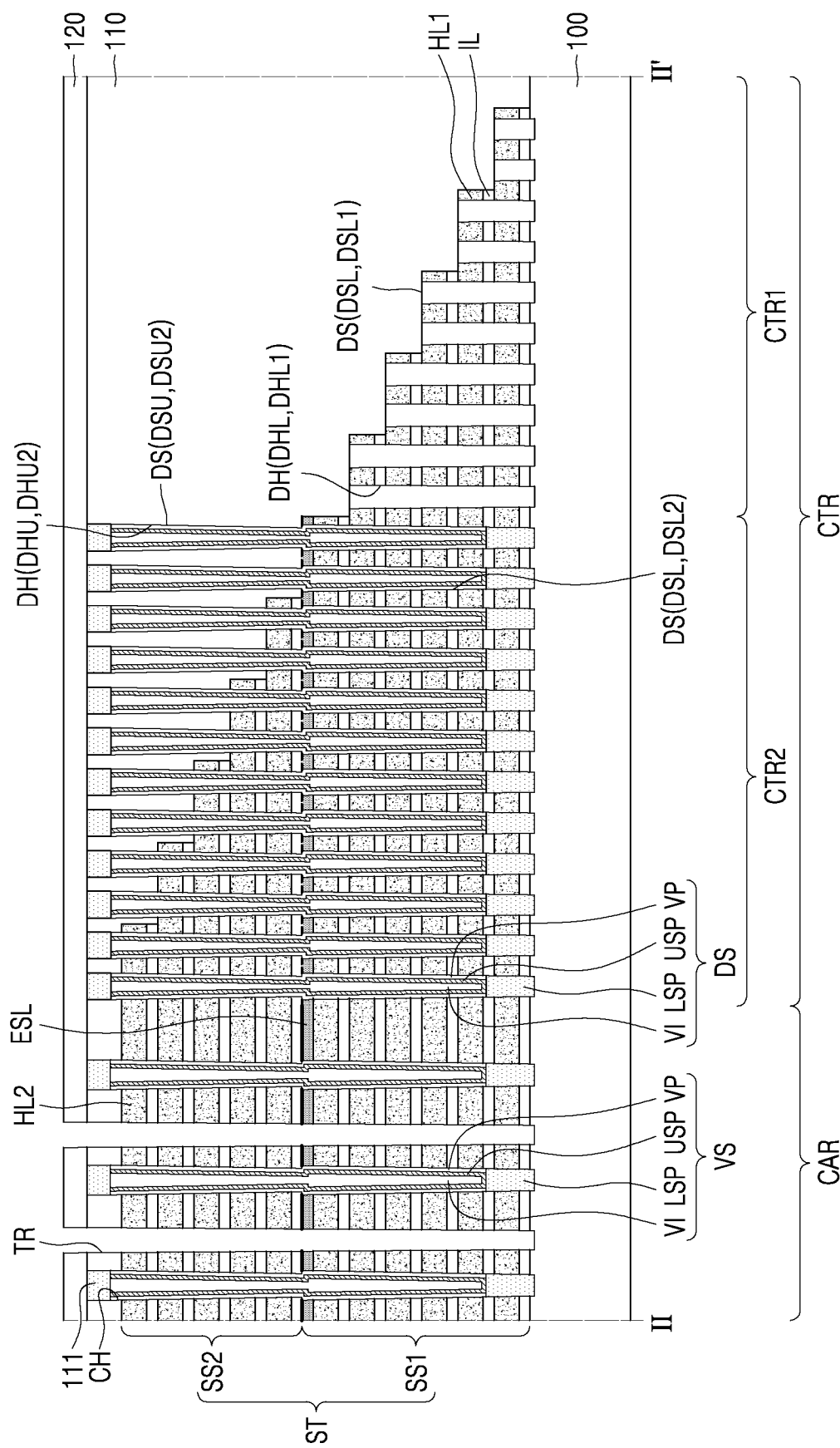

Referring to FIG. 26, the first interlayer insulation layer 120 may be formed on the buried insulation layer 110. The stacked structures ST horizontally apart from one another may be formed by patterning the stacked structure ST. The stacked structures ST may be arranged in the second direction (Y-direction) while extending in the first direction (X-direction).

Trenches TR may be defined between the stacked structures ST adjacent to each other. The trenches TR may expose portions of the substrate 100. The trenches TR may extend in the first direction (X-direction) along the stacked structures ST.

Referring back to FIGS. 18 and 19, the first and second sacrificial layers HL1 and HL2 may be replaced by the electrodes EL. In detail, the first and second sacrificial layers HL1 and HL2 exposed through the trenches TR are selectively removed, and the electrodes EL may be formed in spaces from which the first and second sacrificial layers HL1 and HL2 are removed.

In some embodiments, the operation for replacing the first and second sacrificial layers HL1 and HL2 with the electrodes EL may be performed after the fabrication process of FIG. 23. For example, as shown in FIG. 23, the first and second sacrificial layers HL1 and HL2 exposed through the lower channel hole CHL, the upper channel hole CHU, and the second lower dummy hole DHL2 may be selectively removed, and the electrodes EL may be formed in the spaces from which the first and second sacrificial layers HL1 and HL2 are removed.

The common source regions CSR may be formed by doping portions of the substrate 100 exposed through the trenches TR. The insulation spacers SP and the common source plugs CSP sequentially filling the trenches TR may be formed. The common source plugs CSP may be connected to the common source regions CSR.

The second interlayer insulation layer 130 may be formed on the first interlayer insulation layer 120. Bit line contact plugs BPLG that penetrate through the first interlayer insulation layer 120 and the second interlayer insulation layer 130 and are connected to the vertical structures VS may be formed. The contact plugs CP that penetrate through the first interlayer insulation layer 120, the second interlayer insulation layer 130, through the buried insulation layer 110 and are connected to the electrodes EL may be formed.

The bit lines BL electrically connected to the bit line contact plugs BPLG and the first and second circuit lines CL1 and CL2 electrically connected to the contact plugs CP may be formed on the second interlayer insulation layer 130.

In the example method of fabricating a 3-dimensional semiconductor memory device, according to the inventive concept, the second lower dummy hole DHL2 and the first lower dummy hole DHL1 are formed in the second connecting region CTR2 and the first connecting region CTR1 during the formation of the lower channel hole CHL. Also, in the example method for fabricating a 3-dimensional semiconductor memory device according to the inventive concept, after the upper stacked structure SS2 is formed, the second upper dummy hole DHU2 is formed in the second connecting region CTR2 and the buried insulation layer 110 is formed in the first connecting region CTR1.

Through this fabrication process, the dummy holes DH formed in the second connecting region CTR2 and the first connecting region CTR1 may have various surface pattern shapes and, by forming the buried insulation layer 110 on the first connecting region CTR1, the freedom of design of the 3-dimensional semiconductor memory device 20 may be improved.

FIG. 27 is a conceptual diagram for explaining a fabricating sequence of a 3-dimensional semiconductor memory device according to an example embodiment.

In detail, FIG. 27 may include a sequence of fabricating the 3-dimensional semiconductor memory device described above with reference to FIGS. 17 to 26. In the description of FIG. 27, the same reference numerals as those in FIGS. 17 to 26 denote the same elements. In addition, in the description of FIG. 27, the same reference numerals as those in FIG. 16 denote the same elements.

First, a lower mold layer is formed on the cell array region CAR and the connecting region CTR to form the lower stacked structure SS1 (operation S1). The lower mold layer may be a structure in which the insulation layers IL and first sacrificial layers HL1 described above are stacked.

Subsequently, an operation for forming the lower channel hole CHL through the lower stacked structure SS1 of the cell array region CAR is performed (operation S2). Subsequently, an operation for forming the first lower dummy hole DHL1 and the second lower dummy hole DHL2 penetrating through the lower stacked structures SS1 of the first connecting region CTR1 and the second connecting region CTR2 is performed (operation S3). Operation S2 for forming the lower channel hole CHL and operation S3 for forming the first lower dummy hole DHL1 and the second lower dummy hole DHL2 may be performed simultaneously.

Next, an operation for forming an upper mold layer on the cell array region CAR and the connecting region CTR to form the upper stacked structure SS2 is performed (operation S4). The upper mold layer may be a structure in which the insulation layers IL and second sacrificial layers HL2 described above are stacked. Subsequently, an operation for forming the upper channel hole CHU through the upper stacked structure SS2 of the cell array region CAR is performed (operation S5).

Subsequently, an operation for forming a stepped structure by patterning one side of the lower stacked structure SS1 and one side of the upper stacked structure SS2 in the connecting region CTR is performed (operation S6). In some embodiments, an operation for replacing the first sacrificial layer HL1 and the second sacrificial layer HL2 included in the lower mold layer and the upper mold layer with the electrodes EL may be performed.

Next, an operation for forming the buried insulation layer 110 covering the upper stacked structure SS2 and the lower stacked structure SS1 of the cell array region CAR and the connecting region CTR is formed (operation S7). Subsequently, an operation for forming the second upper dummy hole DHU2 penetrating through the upper stacked structure SS2 of the second connecting region CTR2 is performed (operation S8).

While the inventive concept has been particularly illustrated and described with reference to it, it will be understood that various changes in form and details may be made without departing from the spirit and scope of the following claims.

What is claimed is:

1. A 3-dimensional semiconductor memory device comprising:
    a substrate comprising a cell array region and a connecting region;
    a stacked structure comprising insulation layers and electrodes alternately and vertically stacked on the substrate, and comprising a stepped structure in the connecting region, and comprising a lower stacked structure and an upper stacked structure sequentially stacked on the substrate;
    vertical structures in channel holes penetrating through the lower stacked structure and the upper stacked structure on the cell array region; and
    dummy structures in dummy holes penetrating through at least one of the lower stacked structure and the upper stacked structure on the connecting region,
    wherein the connecting region comprises a second connecting region on one side of the cell array region and a first connecting region on one side of the second connecting region, the second connecting region being between the first connecting region and the cell array region, and
    wherein the dummy holes comprise a first dummy hole in the first connecting region and a second dummy hole in the second connecting region, and a surface pattern shape of the first dummy hole is different from a surface pattern shape of the second dummy hole.

2. The 3-dimensional semiconductor memory device of claim 1,
    wherein the first dummy hole includes a first lower dummy hole penetrating through the lower stacked structure and a first upper dummy hole penetrating through an insulating layer,
    wherein a surface pattern shape of the first lower dummy hole is different from a surface pattern shape of the first upper dummy hole,
    wherein the second dummy hole includes a second lower dummy hole penetrating through the lower stacked structure and a second upper dummy hole penetrating through the upper stacked structure, and
    wherein a surface pattern shape of the second lower dummy hole is different from a surface pattern shape of the second upper dummy hole.

3. The 3-dimensional semiconductor memory device of claim 1,
    wherein the second dummy hole comprises a second lower dummy hole penetrating through the lower stacked structure and a second upper dummy hole penetrating through the upper stacked structure, and
    wherein a surface pattern shape of the second lower dummy hole penetrating through the lower stacked structure of the second connecting region is different from a surface pattern shape of the second upper dummy hole penetrating through the upper stacked structure of the second connecting region.

4. The 3-dimensional semiconductor memory device of claim 1,
    wherein the second dummy hole comprises a second lower dummy hole penetrating through the lower stacked structure and the first dummy hole comprises a first upper dummy hole penetrating through an insulating layer, and
    wherein a surface pattern shape of the second lower dummy hole penetrating through the lower stacked structure of the second connecting region is different from a surface pattern shape of the first upper dummy hole penetrating through the insulating layer in the first connecting region.

5. The 3-dimensional semiconductor memory device of claim 1,
    wherein the second dummy hole comprises a second upper dummy hole penetrating through the upper stacked structure and the first dummy hole comprises a first lower dummy hole penetrating through the stacked structure, and
    wherein a surface pattern shape of the second upper dummy hole penetrating through the upper stacked structure of the second connecting region is different from a surface pattern shape of the first lower dummy hole penetrating through the lower stacked structure in the first connecting region.

6. The 3-dimensional semiconductor memory device of claim 1,
    wherein the first dummy hole comprises a first lower dummy hole penetrating through the lower stacked structure and a first upper dummy hole penetrating through an insulating layer, and
    wherein a surface pattern shape of the first upper dummy hole penetrating through the insulating layer in the first connecting region is different from a surface pattern shape of the first lower dummy hole penetrating through the lower stacked structure in the first connecting region.

7. The 3-dimensional semiconductor memory device of claim 1,
wherein the first dummy hole comprises a first upper dummy hole penetrating through an insulating layer and the second dummy hole comprises a second upper dummy hole penetrating through the upper stacked structure, and
wherein a surface pattern shape of the first upper dummy hole penetrating through the insulating layer in the first connecting region is different from a surface pattern shape of the second upper dummy hole penetrating through the upper stacked structure of the second connecting region.

8. The 3-dimensional semiconductor memory device of claim 1,
wherein the second dummy hole comprises a second lower dummy hole penetrating through the lower stacked structure and a second upper dummy hole penetrating through the upper stacked structure, and the first dummy hole comprises a first lower dummy hole penetrating through the lower stacked structure, and
wherein a surface pattern shape of the second lower dummy hole penetrating through the lower stacked structure of the second connecting region and a surface pattern shape of the first lower dummy hole penetrating through the lower stacked structure in the first connecting region are different from a surface pattern shape of the second upper dummy hole penetrating through the upper stacked structure of the second connecting region.

9. The 3-dimensional semiconductor memory device of claim 8,
wherein the channel holes include upper channel holes penetrating through the upper stacked structure and lower channel holes penetrating through the lower stacked structure, and
wherein a surface pattern shape of the upper channel holes is different than a surface pattern shape of the lower channel holes.

10. The 3-dimensional semiconductor memory device of claim 1,
wherein the second dummy hole comprises a second lower dummy hole penetrating through the lower stacked structure and the first dummy hole comprises a first lower dummy hole penetrating through the lower stacked structure, and
wherein a surface pattern shape of the second lower dummy hole penetrating through the lower stacked structure of the second connecting region is different from a surface pattern shape of the first lower dummy hole penetrating through the lower stacked structure in the first connecting region.

11. The 3-dimensional semiconductor memory device of claim 1,
wherein the second dummy hole comprises a second lower dummy hole penetrating through the lower stacked structure in the second connecting region and a second upper dummy hole penetrating through the upper stacked structure in the second connecting region,
wherein the first dummy hole comprises a first lower dummy hole penetrating through the lower stacked structure in the first connecting region, and
wherein an insulation layer covers the lower stacked structure and the first lower dummy hole in the first connecting region.

12. The 3-dimensional semiconductor memory device of claim 1,
wherein the second connecting region comprises a region where a second circuit line electrically connected to electrodes of the upper stacked structure is disposed on one side of the cell array region, and
wherein the first connecting region comprises a region where a first circuit line electrically connected to electrodes of the lower stacked structure is disposed on one side of the second connecting region.

13. A 3-dimensional semiconductor memory device comprising:
a substrate comprising a cell array region and a connecting region;
a stacked structure comprising insulation layers and electrodes alternately and vertically stacked on the substrate, and comprising a stepped structure in the connecting region, and comprising a lower stacked structure and an upper stacked structure sequentially stacked on the substrate;
vertical structures penetrating through the lower stacked structure and the upper stacked structure on the cell array region; and
dummy structures penetrating through at least one of the lower stacked structure and the upper stacked structure on the connecting region,
wherein the connecting region comprises a second connecting region on one side of the cell array region and a first connecting region on one side of the second connecting region, the second connecting region being between the first connecting region and the cell array region,
wherein the dummy structures comprise a first dummy structure and a second dummy structure,
wherein the second dummy structure comprises a second lower dummy structure and a second upper dummy structure which respectively penetrate through the lower stacked structure and the upper stacked structure of the second connecting region and are connected to each other, and the first dummy structure comprises a first lower dummy structure and a first upper dummy structure which respectively penetrate through the lower stacked structure and an insulating layer of the first connecting region and are connected to each other, and
wherein the second dummy structure comprises a non-continuous portion where diameters of the second lower dummy structure and the second upper dummy structure vary non-continuously at a boundary region of the second lower dummy structure and the second upper dummy structure.

14. The 3-dimensional semiconductor memory device of claim 13, wherein the first upper dummy structure and the first lower dummy structure comprise continuous portions where diameters gradually and continually increase.

15. The 3-dimensional semiconductor memory device of claim 13, wherein the first upper dummy structure and the first lower dummy structure constitute the same body.

16. The 3-dimensional semiconductor memory device of claim 13,
wherein each vertical structure of the vertical structures comprises a lower vertical structure and an upper vertical structure that penetrate through the lower stacked structure and the upper stacked structure, respectively, and are connected to each other, and wherein the vertical structure comprises a non-continuous portion where diameters of the lower vertical structure and the upper vertical structure vary non-continuously at a boundary region of the upper vertical structure and the lower vertical structure.

17. The 3-dimensional semiconductor memory device of claim 13, wherein the second lower dummy structure and the second upper dummy structure are formed in a second lower dummy hole and a second upper dummy hole respectively penetrating through the lower stacked structure and the upper stacked structure of the second connecting region, and wherein the first lower dummy structure and the first upper dummy structure are formed in a first lower dummy hole and a first upper dummy hole respectively penetrating through the lower stacked structure and the insulating layer in the first connecting region.

18. The 3-dimensional semiconductor memory device of claim 13, wherein an etch stop layer is formed on the uppermost portion of the lower stacked structure in the second connecting region, and wherein an etch stop layer is not formed on the uppermost portion of the lower stacked structure in the first connecting region.

19. A 3-dimensional semiconductor memory device comprising:

a substrate comprising a cell array region and a connecting region;

a stacked structure comprising insulation layers and electrodes alternately and vertically stacked on the substrate, and comprising a stepped structure in the connecting region, and comprising a lower stacked structure and an upper stacked structure sequentially stacked on the substrate;

vertical structures penetrating through the lower stacked structure and the upper stacked structure on the cell array region; and dummy structures penetrating through at least one of the lower stacked structure and the upper stacked structure on the connecting region, wherein the connecting region comprises a second connecting region on one side of the cell array region and a first connecting region on one side of the second connecting region, the second connecting region being between the first connecting region and the cell array region, wherein the dummy structures comprise a first dummy structure and a second dummy structure, wherein the second dummy structure comprises a second lower dummy structure and a second upper dummy structure which respectively penetrate through the lower stacked structure and the upper stacked structure of the second connecting region and are connected to each other, and the first dummy structure comprises a first lower dummy structure which penetrates through the lower stacked structure of the first connecting region, wherein the second dummy structure comprises a non-continuous portion where diameters of the second lower dummy structure and the second upper dummy structure vary non-continuously at a boundary region of the second lower dummy structure and the second upper dummy structure, and wherein an insulation layer covering the lower stacked structure is formed in the first connecting region.

20. The 3-dimensional semiconductor memory device of claim 19, wherein each vertical structure of the vertical structures comprises a lower vertical structure and an upper vertical structure that penetrate through the lower stacked structure and the upper stacked structure, respectively, and are connected to each other, and wherein the vertical structure comprises a non-continuous portion where diameters of the lower vertical structure and the upper vertical structure vary non-continuously at a boundary region of the upper vertical structure and the lower vertical structure.

\* \* \* \* \*